United States Patent
Alizadeh et al.

(10) Patent No.: US 12,362,140 B2
(45) Date of Patent: Jul. 15, 2025

(54) GLOW PLASMA STABILIZATION

(71) Applicant: Servomex Group Limited, Crowborough (GB)

(72) Inventors: Bahram Alizadeh, Maidstone (GB); Martin Lopez, Rotherfield (GB); Michael Anthony Ratcliffe, Crowborough (GB); Nicky Jay Batson, Crowborough (GB)

(73) Assignee: Servomex Group Limited, Crowborough (GB)

( * ) Notice: Subject to any disclaimer, the term of this patent is extended or adjusted under 35 U.S.C. 154(b) by 1043 days.

(21) Appl. No.: 16/841,051

(22) Filed: Apr. 6, 2020

(65) Prior Publication Data
US 2020/0343074 A1    Oct. 29, 2020

(30) Foreign Application Priority Data
Apr. 5, 2019 (GB) ..................... 1904896

(51) Int. Cl.
*H01J 37/32* (2006.01)
*G01J 3/443* (2006.01)
(Continued)

(52) U.S. Cl.
CPC ......... *H01J 37/32045* (2013.01); *G01J 3/443* (2013.01); *G01N 21/67* (2013.01);
(Continued)

(58) Field of Classification Search
CPC ................ G01J 3/447; G01N 21/68
See application file for complete search history.

(56) References Cited

U.S. PATENT DOCUMENTS 5,086,226 A    2/1992    Marcus
5,414,324 A    5/1995    Roth et al.
(Continued)

FOREIGN PATENT DOCUMENTS

EP    1381257 A2 *  1/2004    ........ H01J 37/32082
EP    3 265 806 B1    4/2020
(Continued)

OTHER PUBLICATIONS

Great Britain Combined Search and Examination Report dated Aug. 22, 2019 for Great Britain Application No. GB1904896.6; 7 Pages.
(Continued)

*Primary Examiner* — Srinivas Sathiraju
(74) *Attorney, Agent, or Firm* — Daly, Crowley, Mofford & Durkee, LLP

(57) ABSTRACT

Provided are methods, apparatus and systems for stabilization of a glow discharge from a plasma. Also provided are methods, apparatus and systems for processing optical signals from a stabilised glow plasma with enhanced signal to noise recovery. A first method comprises: generating an electric field within a plasma cell using an alternating excitation voltage to excite particles within the cell, to produce a glow discharge from a plasma in the plasma cell in a resonant condition; monitoring, in each excitation cycle of the alternating excitation voltage, one or more signals that correlate with glow discharge optical emissions from the plasma in the plasma cell; and, in response to said monitoring, controlling one or more operating conditions for the plasma cell to maintain the glow discharge emissions from the plasma within a desired operating range in each excitation cycle of the alternating excitation voltage. A relatively stable glow discharge optical emission is maintained via dynamic resonant feedback control of operating conditions such as the electric field that is used to excite particles within
(Continued)

the plasma cell. The stabilization of the glow plasma can be used in glow discharge optical emission spectroscopy (GD-OES) for gas analysis and in other applications.

30 Claims, 25 Drawing Sheets

(51) Int. Cl.
    *G01N 21/67*     (2006.01)
    *G01N 21/68*     (2006.01)
    *H05H 1/00*     (2006.01)
    *H05H 1/24*     (2006.01)

(52) U.S. Cl.
    CPC ........ *G01N 21/68* (2013.01); *H01J 37/32018* (2013.01); *H01J 37/32449* (2013.01); *H01J 37/32926* (2013.01); *H01J 37/32935* (2013.01); *H01J 37/32981* (2013.01); *H05H 1/0037* (2013.01); *H05H 1/4697* (2021.05); *H01J 37/32568* (2013.01); *H01J 37/32972* (2013.01); *H01J 37/3299* (2013.01); *H01J 2237/334* (2013.01)

(56) References Cited

U.S. PATENT DOCUMENTS

| | | | | |
|---|---|---|---|---|
| 6,043,881 | A * | 3/2000 | Wegrzyn ................. | G01N 21/69 356/417 |
| 6,351,131 | B1 * | 2/2002 | Klepper .................. | G01L 21/34 324/463 |
| 6,442,736 | B1 * | 8/2002 | Girard ................... | C30B 33/005 716/54 |
| 6,594,010 | B2 * | 7/2003 | Malczewski .......... | G01J 3/2803 356/311 |
| 6,717,666 | B2 * | 4/2004 | Satou ..................... | G01N 21/69 356/311 |
| 7,041,608 | B2 * | 5/2006 | Sieber .................... | H10K 71/60 438/609 |
| 7,123,361 | B1 * | 10/2006 | Doughty ................. | H05H 1/30 356/316 |
| 7,242,471 | B2 | 7/2007 | Hirano | |
| 7,753,582 | B2 * | 7/2010 | Lopez .................... | G01N 25/18 374/185 |
| 8,069,738 | B2 * | 12/2011 | Lopez .................... | G01N 1/2258 73/863.83 |
| 8,239,171 | B2 | 8/2012 | Gamache et al. | |
| 8,761,594 | B1 * | 6/2014 | Gross ..................... | G01S 7/4817 396/155 |
| 8,915,538 | B2 * | 12/2014 | Bland ..................... | B62D 29/04 296/192 |
| 9,015,852 | B2 * | 4/2015 | Thubert ................. | H04L 45/742 726/26 |
| 10,121,708 | B2 * | 11/2018 | Sakiyama ............... | C23C 16/50 |
| 10,651,014 | B2 * | 5/2020 | Roy ....................... | H01J 37/3255 |
| 10,989,724 | B1 * | 4/2021 | Holmes .................. | G01N 35/10 |
| 11,112,418 | B1 * | 9/2021 | Holmes .................. | G01N 15/1434 |
| 11,948,774 | B2 * | 4/2024 | Alizadeh ............... | H05H 1/4697 |
| 2003/0007146 | A1 * | 1/2003 | Malczewski ............ | G01J 3/443 356/311 |
| 2007/0029500 | A1 * | 2/2007 | Coulombe .............. | H01T 23/00 250/423 F |
| 2007/0056841 | A1 | 3/2007 | Agarwal et al. | |
| 2008/0259062 | A1 * | 10/2008 | Lee ........................ | G09G 3/296 345/204 |
| 2009/0030632 | A1 | 1/2009 | Tallavarjula et al. | |
| 2010/0209311 | A1 * | 8/2010 | Mills ....................... | G21B 3/00 422/186.04 |
| 2011/0304322 | A1 * | 12/2011 | Kovacich ............... | G01N 27/76 324/201 |
| 2012/0255932 | A1 * | 10/2012 | Tabib-Azar ............. | H05H 1/32 118/712 |
| 2017/0064806 | A1 | 3/2017 | Aoi et al. | |
| 2017/0141001 | A1 * | 5/2017 | Sakiyama ......... | H01J 37/32137 |
| 2018/0038800 | A1 * | 2/2018 | Gamache ................ | G01J 3/443 |
| 2018/0197643 | A1 | 7/2018 | Morris et al. | |
| 2018/0204709 | A1 * | 7/2018 | Hilt .................... | H01J 37/32192 |
| 2018/0271579 | A1 * | 9/2018 | Keidar ................ | A61B 18/042 |
| 2019/0051502 | A1 | 2/2019 | Asakura et al. | |
| 2019/0201047 | A1 * | 7/2019 | Yates ................. | A61B 18/1445 |
| 2019/0206658 | A1 * | 7/2019 | Roy ................... | H01J 37/32348 |
| 2019/0328440 | A1 * | 10/2019 | Chen .................... | A61B 18/042 |
| 2020/0135350 | A1 * | 4/2020 | Farouk ...................... | G21F 5/06 |
| 2020/0325049 | A1 * | 10/2020 | Roy .......................... | A61L 2/24 |
| 2020/0343074 | A1 * | 10/2020 | Alizadeh ............. | H05H 1/4697 |
| 2021/0283290 | A1 * | 9/2021 | Vandermeulen ...... | A61L 2/0094 |
| 2021/0310956 | A1 * | 10/2021 | Alizadeh ............. | H05H 1/0037 |
| 2022/0044919 | A1 * | 2/2022 | Takahashi ............. | H01J 49/105 |
| 2023/0143022 | A1 * | 5/2023 | Mills .................... | C25B 11/042 423/239.1 |

FOREIGN PATENT DOCUMENTS

| | | | | |
|---|---|---|---|---|
| EP | 3 719 482 A2 | 10/2020 | | |
| GB | 2 381 375 A | 4/2003 | | |
| GB | 2583897 A | * 11/2020 | ............. | G01J 3/443 |
| GB | 2593983 A | * 10/2021 | ............. | G01J 3/433 |
| GB | 2594050 A | * 10/2021 | ............. | G01J 3/433 |
| GB | 2598936 A | * 3/2022 | ............. | B01J 19/08 |
| GB | 2599603 A | * 4/2022 | ............. | G01J 3/443 |
| JP | H 0978248 A | 3/1997 | | |
| WO | WO 99/37581 | 7/1999 | | |
| WO | WO-9937581 A2 | * 7/1999 | ............ | B01J 19/088 |
| WO | WO 2016/141470 A1 | 9/2016 | | |

OTHER PUBLICATIONS

Great Britain Examination Report dated Mar. 24, 2020 for Great Britain Application No. GB1904896.6; 2 Pages.
Great Britain Examination Report and Notification of Intention to Grant dated Jul. 6, 2022 for Great Britain Application No. GB2200249.7; 2 Pages.
Great Britain Notification of Grant dated Sep. 27, 2022 for Great Britain Application No. GB2200249.7; 2 Pages.
Great Britain Examination Report dated Nov. 22, 2021 for Great Britain Application No. GB2005079.5; 4 Pages.
Great Britain Notification of Grant dated Feb. 15, 2022 for Great Britain Application No. GB2005079.5; 2 Pages.
European Examination Report dated Oct. 10, 2022 for European Application No. 20168332.3; 7 Pages.
Xiao et al., "Significant Sensitivity Improvement of Alternating Current Driven-Liquid Discharge by Using Formic Acid Medium for Optical Determination of Elements;" Talanta, Elsevier, vol. 106; Dec. 14, 2012; pp. 144-149; 6 Pages.
Extended European Search Report dated Nov. 9, 2020 for European Application No. 20168332.3; 11 Pages.
Canadian Examination Report dated Feb. 8, 2023 for Canadian Application No. 3,077,841; 3 Pages.
Canadian Examination Report dated Feb. 14, 2024 for Canadian Application No. 3,077,841; 3 Pages.
Chinese 1$^{st}$ Office Action (with English Translation) dated Feb. 29, 2024 for Chinese Application No. 202010267949.3; 18 Pages.
Great Britain Examination Report dated Mar. 24, 2020 for Great Britain Application No. 1904896.6; 2 Pages.
Great Britain Search and Examination Report dated Aug. 12, 2020 for Great Britain Application No. 2005079.5; 3 Pages.
Great Britain Search Report dated Jan. 26, 2022 for Great Britain Application No. 2200249.7; 1 Page.
European Examination Report dated Jul. 11, 2024 for European Application No. 20168332.3; 5 Pages.
Response to European Examination Report dated Jul. 11, 2024 for European Application No. 20168332.3; Response Filed Jan. 13, 2025; 12 Pages.
Chinese 2$^{nd}$ Office Action (with Machine English Translation) dated Sep. 10, 2024 for Chinese Application No. 202010267949.3; 11 Pages.

(56) References Cited

OTHER PUBLICATIONS

Response (with Machine English Translation) to Chinese $2^{nd}$ Office Action dated Sep. 10, 2024 for Chinese Application No. 202010267949.3; Response Filed Feb. 8, 2025; 48 Pages.

* cited by examiner

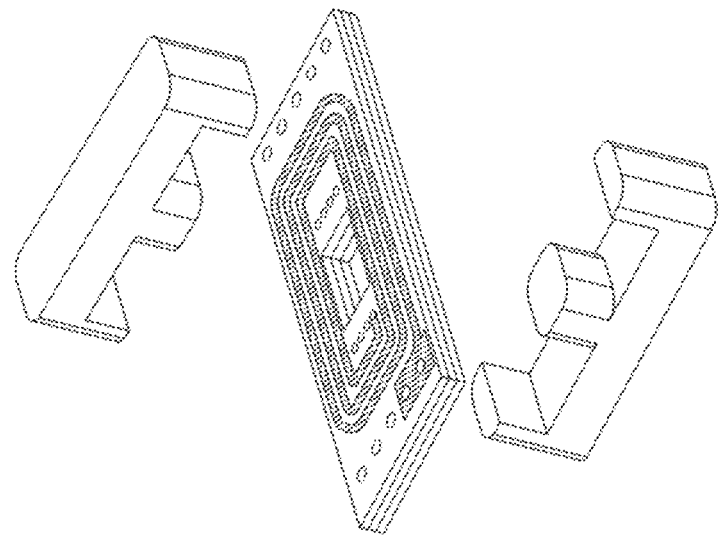
Figure 8b
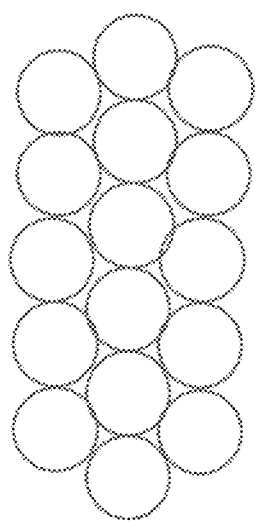
Figure 8a: Prior Art

GLOW PLASMA STABILIZATION

CROSS REFERENCE TO RELATED APPLICATIONS

This application claims priority under 35 U.S.C § 119 to United Kingdom Patent Application No. 1904896.6 filed on Apr. 5, 2019 and entitled "Glow Plasma Stabilisation," which is incorporated herein by reference in its entirety.

BACKGROUND

Plasma is composed of ionised gas molecules in a mixture of free electrons, neutral molecules and photons of light of various wavelengths. Plasma can take many forms, both naturally occurring, such as in stars, nebulae, flames and lightning, or man-made such as arc discharges in high strength electric fields. Plasmas may occur both at high and low pressures. Reduced pressure plasmas have the advantages of requiring a lower strike voltage (ignition of plasma) and maintenance voltage (voltage to sustain a plasma), as well as decreased incidence of quenching due to lower species density, but there are increased costs and complexity associated with obtaining this lower pressure and the total amount of ionised molecules may be reduced compared to a higher pressure plasma.

Plasmas are used in material processing applications such as surface cleaning for the preparation of substrates for thin film depositing. They are also used in plasma lighting, ozone production, etching of computer chips, and manufacture of solar cells.

US2018/0197643 A1 discloses an apparatus for monitoring and controlling exothermic reactions, using initiation of a plasma as an activation process for the reactions. The apparatus is operated at low pressure and the plasma is monitored using a photon detection device to determine its state and adjusted for activation of reactions. The plasma can be a glow discharge, arcing, sparking or other plasma.

US 2009/0030632 A1 discloses monitoring plasma stability of a process chamber. The described device for matching between semiconductor substrate plasma processing chambers uses spectrometer comparative measurements using a calibrated spectral reference to allow correlation of process parameters and plasma emission spectra during process perturbations.

US 2019/0051502 A1 discloses a device for plasma processing that is operated under low pressure, which uses spectroscopic information and predictive models.

US2017/0064806 A1 discloses a plasma thruster for space rockets, which is designed to operate at low pressure. It mentions the need to control the amount of electrical power and gas supplied, and the use of electron density measurements via a probe inserted inside the plasma vessel, to achieve the degree of stability of conditions needed for an ion beam space rocket thruster or similar plasma thruster.

U.S. Pat. No. 8,239,171 B1 discloses a device that achieves a reduction of the effect of background impurities in the measurement of trace levels of gas (such as nitrogen) in noble gases (such as helium or argon) using a plasma, primarily via the use of traps to capture impurities and a permeation tube to selectively add moisture.

An inductive feedback technique has been used to improve the stability and flexibility of glow plasmas for use in surface treatments, to avoid damaging the surface. EP 1381257 A2 discloses apparatus for producing and sustaining a glow discharge plasma under atmospheric pressure, for use in surface treatment of materials. EP 1381257 A2 refers to its differences from the inductor and plasma chamber of U.S. Pat. No. 5,414,324, which is also disclosed for use in treatment of surfaces.

EP 3265806 A1 discloses use of secondary stabilization electrodes to apply a transverse electric field and/or to provide electron injection.

Within a glow plasma, electrons and other ionised species are not in thermal equilibrium, and the energy associated with the excited particles within the electric field may be well above that of the average energy for the mixture. The electric field and inelastic collisions between the accelerated electrons and gas molecules lead to the creation of excited and ionised species. The subsequent radiative decay to lower energy levels results in the emission of characteristic photons of radiation that gives the name of "glow" discharge.

SUMMARY

Provided are methods, apparatus and systems for stabilization of a glow discharge from a plasma. Also provided are methods, apparatus and systems for processing optical and non-optical signals from a stabilised glow plasma including processing optical signals with enhanced signal to noise recovery.

According to the methods, apparatus and systems described in this specification, relatively stable glow discharge optical emissions can be maintained from a plasma in a plasma cell, via monitoring one or more glow discharge optical emissions or one or more signals that correlate with the optical emissions, and providing dynamic resonant feedback control of operating conditions such as the electric field that is used to excite particles (such as atoms, molecules and charged species) within the plasma cell. The stabilization of the glow plasma can be used in glow discharge optical emission spectroscopy (GD-OES) and non-optical analysis for gas analysis, and in other applications.

A first method described herein comprises: generating an electric field within a plasma cell using an alternating excitation voltage to excite particles within the cell, to produce a glow discharge from a plasma in the plasma cell; monitoring, in each excitation cycle of the alternating excitation voltage, one or more signals that correlate with glow discharge optical emissions from the plasma in the plasma cell; and, in response to said monitoring, controlling one or more operating conditions for the plasma cell to maintain the glow discharge emissions from the plasma within a desired operating range in each excitation cycle of the alternating excitation voltage.

The monitoring may involve monitoring a plasma excitation current, or the monitoring may involve optically monitoring the glow discharge emissions from the plasma or monitoring an electrical signal that is generated from and correlates with the glow discharge emissions. The method may involve determining, in each excitation cycle of the alternating excitation voltage, operating conditions for the plasma cell to maintain the glow discharge optical emissions from the plasma within a desired operating range, and then adjusting the operating conditions to maintain the glow discharge optical emissions within the desired operating range.

In an example method described herein, a stable glow discharge plasma is maintained in a plasma cell by applying an input signal to two or more electrodes in the plasma cell to generate a voltage gradient between the electrodes, measuring an induced signal across the plasma cell, and comparing the induced signal with a reference signal to obtain a difference signal. This comparison is performed at plasma resonance. References to 'resonance' and 'resonant conditions' herein are, as explained below, not to be interpreted as a limitation to peak resonance unless this is stated explicitly. A control signal is then applied to the at least two electrodes in the plasma cell based on the obtained difference signal to achieve a desired voltage gradient between the electrodes for the excitation that is needed for a stable glow under resonance conditions. The measuring of the induced signal may involve real-time measurements of the plasma current or a signal that is generated from or correlates with the plasma current, within each excitation cycle.

An example system described herein comprises: a plasma cell; an electric field generator for generating an electric field within the plasma cell using an alternating excitation voltage to excite particles within the cell, to produce a glow discharge from a plasma in the plasma cell; and a controller module for: monitoring one or more signals that correlate with the glow discharge optical emissions in each excitation cycle of the alternating excitation voltage; and, in response to said monitoring, controlling one or more operating conditions for the plasma cell in a resonant condition to maintain the glow discharge emissions from the plasma within a desired operating range in each excitation cycle of the alternating excitation voltage.

An example control circuit is described herein, for controlling an electric field within a plasma cell operating at resonance. The circuit comprises: a sense resistor ($R_s$) and a meter to measure an electrical signal that correlates with a glow discharge emission from a plasma in the plasma cell; a high speed differential amplifier configured to produce an error signal proportional to the difference between the measured electrical signal and a reference signal; a transformer ($T_1$) configured to apply a control signal to an electric field generator; and an electric field generator for generating, in response to the control signal, an alternating excitation voltage of variable amplitude and/or frequency to excite gas particles within the plasma cell; wherein the control circuit is adapted to measure the electric signal across the sense resistor and to control the electric field generator to adjust the alternating excitation voltage, in each cycle of the alternating excitation voltage, to maintain a stable glow discharge emission from the plasma in the plasma cell.

An example use of the above-described method, system and control circuit is for gas analysis, using glow discharge optical emission spectroscopy (GD-OES) with dynamic feedback resonant control for stabilization of a glow plasma. The plasma cell can be operated at atmospheric pressure—potentially achieving a stable, filament-free plasma without the need for vacuum systems. Continuous gas sensing operation is possible.

An example method for glow discharge optical emission spectroscopy (GD-OES), for a gas supplied to a plasma cell, comprises: generating an electric field within the plasma cell using an alternating excitation voltage to excite gas particles within the cell, to produce a glow discharge from a plasma in the plasma cell in a resonant condition; monitoring, in each excitation cycle of the alternating excitation voltage, one or more signals that correlate with glow discharge optical emissions from the plasma in the plasma cell; in response to said monitoring, controlling one or more operating conditions for the plasma cell to maintain the glow discharge emissions from the plasma within a desired operating range in each excitation cycle of the alternating excitation voltage; and analysing the optical emissions to determine the constituents of the gas supplied to the plasma cell.

In an example method for GD-OES, the optical emissions from the plasma generated in the plasma cell is used to measure the concentrations of gases in a mixture. A drive frequency is scanned or chirped across a defined frequency range and the variation in a measured parameter or parameters with frequency is used to determine the concentration of a gas component in a gas mixture. The drive frequency may be scanned or chirped across a defined frequency range either on a regular or variable basis and a plasma excitation frequency may be actively adapted to substantially coincide with the peak resonance related to a species mixture to be analysed.

An alternative method may also be employed for non-optical signal analysis enabling gas concentration measurements within a gas mixture and this will be treated in more detail later in this patent specification. A drive frequency is scanned or chirped across a defined frequency range and the variation in a non-optical measured parameter or parameters with frequency is used to determine the concentration of a gas component in a gas mixture. The drive frequency may be scanned or chirped across a defined frequency range either on a regular or variable basis and a plasma excitation frequency may be actively adapted to substantially coincide with the peak resonance related to a species mixture to be analysed. Example control mechanisms can actively adapt or control one or more of the following parameters to control glow discharge optical emission from plasma within a plasma cell:

- the electrode geometry, such as distance between electrodes and the size/shape of electrode, as described below;
- the interface between electrodes and the plasma, such as the type of dielectric material and/or thickness of dielectric material, as described below;
- the frequency of an excitation signal, so as to maintain the excitation frequency within an optimum frequency band (referred to herein as the resonant frequency band), as described below;
- the excitation waveform;
- the excitation voltage and/or current, such as in a resonant current feedback control method; and
- an impedance between the excitation source and the plasma; and/or Other example methods and apparatus control energy given to gas molecules before entering the plasma chamber (for example, controlling temperature, pressure or pre-excitation/ionisation).

Thus, the control mechanisms can involve adjustment of one or more electrical input signals, one or more physical adjustments or reconfiguration of the cell components, such as movement of one or more electrodes or adjusting of a dielectric material, or another change or set of changes to the operating conditions such as temperature, pressure flow rate, etc.

Example methods and apparatus described in this specification enable stabilization of glow plasma under a wide range of operating conditions including different gas compositions, types of gases, concentrations of gases and flow rates, using one of the above-described mechanisms or combinations of the above mechanisms.

Also provided are methods, apparatus and systems for processing optical signals from stabilised glow plasmas in real time with enhanced signal to noise recovery. A plasma may be generated using an oscillating electric field or an oscillating magnetic field or a combination of both oscillating electric and magnetic fields. One example method for generating a stable plasma comprises: generating an oscillating electric field and/or an oscillating magnetic field within a plasma cell to excite particles (atoms, molecules or charged species) within the cell, to produce a glow discharge from a plasma in the plasma cell in a resonant condition; wherein monitoring one or more glow discharge optical emissions from the plasma in the plasma cell is performed in real time during each excitation cycle. By monitoring the optical signal at twice the excitation frequency, an improved signal to noise recovery is possible.

Monitoring the signal at twice the excitation frequency (2f) results in signal to noise ratio improvements because of the narrowing of the frequency bandwidth of the signal and because of separation in frequency from the excitation frequency (f), for example by using a notch filter. Signal detection techniques to examine and determine the 2f signal may include one or more of the following: Lock-in detection, synchronous detection, frequency domain analysis such as by using Fast Fourier Transforms (FFTs) and time or frequency domain matched filter techniques, shape filters or other appropriate detection means. The signal may be taken as the peak heights, the peak areas, as integrals of the 2f signal or any other appropriate technique with suitable filtering (e.g. median filter) and/or ensemble averaging and/or moving averaging. The design and implementation of the optical detection system is suitable for measuring the signal in real time. For example, intrinsically low capacitance silicon detectors for ultraviolet or visible light are used as an economical and efficient means of measuring the light, with rapid response times. The signal collection can be achieved after passing through the transmission band of an optical filter or by using a dispersive grating or other appropriate wavelength selection device.

The above-described approach to signal processing provides improved accuracy in the measurement of optical emissions from a glow plasma, as an enhancement to glow discharge optical emission spectroscopy (GD-OES) techniques for gas analysis, and for other applications.

An example method comprises: generating one or more oscillating electromagnetic fields within a plasma cell to excite particles within the cell, to produce a glow discharge plasma in the plasma cell in a resonant condition, and controlling the operating conditions for the plasma cell to maintain glow discharge optical emissions from the plasma within the desired operating range; and monitoring one or more glow discharge optical emissions from the plasma in the plasma cell; wherein said monitoring of the optical emissions comprises: measuring the optical emissions, or measuring a signal that correlates with the optical emissions, at twice the plasma excitation frequency; and processing the signal in real time during each excitation cycle to determine the concentration of a gas within a gas mixture.

An example system comprises: a plasma cell; a voltage generator for generating one or more oscillating electromagnetic fields within the plasma cell, to excite particles within the cell to produce a glow discharge plasma in the plasma cell in a resonant condition; a voltage controller for controlling the operating conditions for the plasma cell to maintain glow discharge optical emissions from the plasma within a desired operating range; and one or more optical detectors coupled to one or more measurement circuits configured to monitor glow discharge optical emissions from the plasma in the plasma cell, wherein said monitoring of the optical emissions comprises measuring the optical emissions, or measuring a signal that correlates with the optical emissions, at twice the plasma excitation frequency; and wherein the system is configured to process the signal in real time during each excitation cycle using a signal processor to determine the concentration of a gas within a gas mixture.

BRIEF DESCRIPTION OF DRAWINGS

Various features of exemplary apparatus, systems and methods are described below, by way of example only, with reference to the accompanying drawings in which:

FIG. 8a is a schematic representation of a conventional wire-wound structure for comparison with FIG. 8b;

FIG. 8b shows the core and PCB windings of a planar transformer;

DETAILED DESCRIPTION

Figure 1:
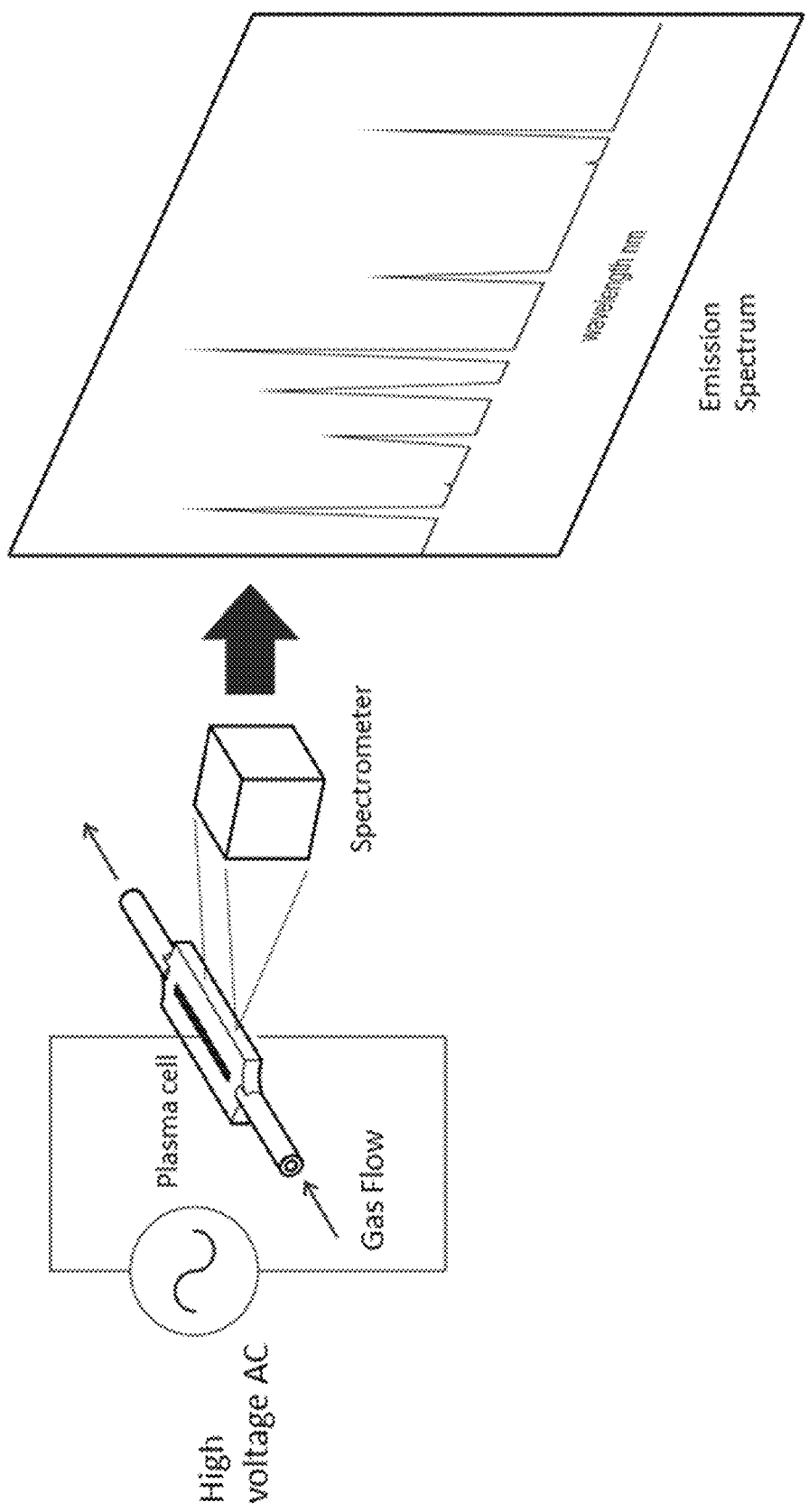
FIG. 1 is a schematic representation of components of an optical emission spectroscopy system, which can use a spectrometer and light emitted by dielectric barrier discharge (DBD) in a plasma cell, for gas analysis.

Glow plasmas have an important application in gas analysis. Optical Emission Spectroscopy (OES) is a technique for species identification and quantification, where light emission from excited state species within a glow plasma is analysed. The location of the emission lines in the electromagnetic spectrum indicates the identity of the species and the intensity denotes the concentration of that gas species in the gas mixture (as shown in FIG. 1). Although glow discharge optical emission spectroscopy (GD-OES) has been used in the analysis of surfaces of solid, conducting materials, it has not been the preferred technology for gas analysis. Most conventional GD-OES systems use a low-pressure glow discharge plasma, but measurements at atmospheric pressure or higher may still be possible in some instances. In gas analysis, glow plasmas may be used to analyse a wide variety of gases including pollutants, and the analysis may be used to control an industrial process to minimise emission levels and gases of interest to optimise process efficiency, reducing power demand and ultimately reducing production of greenhouse gases. Greenhouse gas production is part of most power production and heat production.

Glow discharges may take place in either direct current (DC) or alternating current (AC) excitation fields. DC fields involve direct electrode contact within the gaseous environment, which may be undesirable for the properties and lifetime of the electrode. AC fields can be coupled to the gaseous sample via a dielectric barrier; thus, the electrodes are shielded from direct contact with the gas. Dielectric barrier discharge (DBD) plasmas have been used in industrial ozone production.

An example apparatus, described in detail below, uses glow discharge optical emission spectroscopy in gas analysis. An example uses improved glow plasma stability at atmospheric pressure, for on-line gas analysis. This can be done without the need for secondary electrodes to apply a transverse electric field or to provide electron-injection, which would involve extra build and operational complexity. Also, in the case of electron injection, the presence of such secondary electrodes within the gas stream would expose them to potential contamination and corrosion. As the gas of interest is carried into the plasma, it is excited and the light emitted by the radiative decay is detected by a spectrometer for its unique wavelength signature. OES offers a non-intrusive and very specific information not only on plasma chemistry, but also on the relative concentration of the species. Unlike conventional GD-OES systems, gas analysis applications often require that the gas stream itself does not come into physical contact with the high voltage electrodes to avoid any sputtering effects or chemical reactions on the electrodes. In many gas analysis applications, the gas of interest is in a continuous flow regime which requires a fast response for spectroscopic detection and species identification.

In the GD-OES system described below, an inert carrier or background gas (such as helium, argon, or other noble gas) is used to transport a small volume of the measurand gas through a plasma cell. This enables continuous analysis, but can also be used in a gas chromatographic system. For gas analysis applications, several issues have prevented this technology being a fully flexible and widely implementable technique for gas speciation and determination. These disadvantages can be mitigated as described herein.

Factors that have previously been considered to impede the achievement of stable glow plasmas, especially at higher pressures (for example at atmospheric pressure), for use in plasma etching and gas analysis include the following:
1. High gas flow rates.
2. High measurand concentrations or large compositional variations.
3. High voltages.
4. High costs and energy intensive production of conventional high purity noble carrier gases.

These issues can be addressed as described below.

The ability to maintain a stable glow plasma in high flow rates is useful, for example, as a means to produce more plasma by-products, or in gas analysis if a fast time response to real time concentration changes is to be achieved, especially in continuous stream gas analysis applications. In existing approaches, the presence of high flow rates will usually lead to plasma quenching and hence degradation or loss of measurement. This is due to the plasma being unable to replenish and re-stabilise the energy lost due to the out-flow of excited state gas molecules and influx of cold, unexcited gas molecules.

The presence of high gas mixture concentrations often leads to the depletion or elimination of background excited state molecules. This in turn will lead to plasma quenching. For any stable background composition, the conditions for a glow discharge plasma may be optimised, however, when these conditions vary widely, the deviation from the optimum state may be considerable and hence lead to quenching.

High voltages are used in order to create and maintain glow plasmas, by creating a strong electric field within the gas cell to accelerate ionised species and free electrons. However, there are two issues with this. First, high voltages are difficult to produce and may require specialist design architectures. Secondly, an insufficient level of high voltage will result in plasma quenching, whilst too high a voltage may lead to filamentary discharge (breakdown) within the plasma and hence instability in the optical signal. Both of these situations are undesirable and will lead to unstable operation.

Due to their low ionisation energy, the use of high purity helium and argon as carrier or background gases in glow discharge plasmas has been widespread. This is especially the case with gas chromatographic applications, where large amounts of noble gas carrier gases are used. However, many applications are faced with higher running costs due to a dwindling world supply of helium and argon demand exceeding its production capacity. Additionally, production of these gases, particularly argon and other noble gases, is energy intensive and this contributes to global warming. An example method and apparatus described herein maintains a stable glow plasma in other more abundant inert gases, such as nitrogen, to achieve lower costs and reduce energy demand. In addition, in gas analysis, glow plasmas may be used to analyse a wide variety of gases including pollutants, and the analysis may be used to control an industrial process to minimise emission levels and gases of interest to optimise process efficiency, reducing power demand and ultimately reducing production of greenhouse gases, which is part of most power production and heat production.

Example methods and apparatus as described herein address these shortcomings at the fundamental plasma energy level, to enable stable glow plasma under a very wide range of conditions (e.g. composition, types of gases, concentrations of gases and flow rates). This is achieved via control of the plasma working conditions. Various control mechanisms and combinations of control mechanisms can be used. In an example, this control is achieved through cycle-by-cycle monitoring of the plasma current (i.e. during each excitation cycle) and using feedback control to maintain the plasma current at a defined value. This feedback may be achieved by several methods such as by control of the voltage gradient across the plasma cell in real time. This feedback control can be achieved by multiple means, for example by actively adapting:

- the electrode geometry (e.g. distance between electrodes and size/shape of electrode)
- the interface between electrode and plasma (e.g. type/properties of dielectric material and/or thickness)
- the excitation frequency
- the excitation waveform
- the excitation voltage and/or current
- impedance between the excitation source and the plasma
- energy given to the gas molecules before entering the plasma chamber (e.g. by temperature, or pre-excitation/ionisation);
- gas sample pressure
- gas sample flow rate
- or by a combination of two or more of the above control mechanisms.

References in this patent specification to "resonance" or "resonant conditions" or "resonant frequency" are intended to refer to the functional excitation frequency range (resonant frequency band) for a glow plasma which will be dependent on the gas composition and physical dimensions of the plasma cell, amongst other considerations, such as ambient conditions. Within this range, a glow plasma can be actively maintained, but there will typically be an optimum frequency or peak resonance frequency within the functional glow plasma excitation frequency range, where maximum energy transfer efficiency to the plasma occurs (maximum or peak resonance). For a fixed frequency, the voltage gradient across the plasma cell may be adapted through a feedback mechanism to maintain a stable glow plasma with changing gas composition and/or ambient conditions. Alternatively, for a fixed gas composition and/or ambient conditions, the frequency may be scanned to find the optimum (maximum) resonance peak, or a combination of the two methods may be implemented. The impedance between the electrical excitation source and the plasma cell should be optimised to achieve both stabilization and optimum energy transfer. The optimisation parameters may be determined theoretically, empirically or a combination of both.

There is a compositionally dependent, resonant voltage gradient across the plasma cell that will maintain a glow plasma, and this can be achieved electrically by adjusting the voltage applied to the electrodes. For example, if a defined and/or fixed plasma current profile is maintained by using a feedback circuit or other appropriate means to actively adjust the voltage applied to the electrodes in real time (cycle to cycle), the glow plasma may be stabilised and maintained over a wide range of compositional and ambient conditions. The feedback circuit used is one that is able to cope with high speed feedback implementation.

The input excitation waveform shape may be adjusted, for example, to a sine wave, square wave, saw tooth or other appropriate waveform or combinations of waveforms. However, in most practical, high frequency, electrical implementations, the waveform delivered across the plasma may become pseudo-sinusoidal in form.

Implementation of physically adaptive mechanisms, using such means as servomotors, electromagnetic actuators, piezo electric devices, hydraulic forces, pressure or other appropriate means to adjust the electrodes or dielectrics positions, shapes, properties or combination of two or more of these parameters, for example, can be selected or designed so as to be able to cope with high frequency operation to move to accurately controlled, repeatable positions. Some implementations, such as using electromagnetic actuation to adjust a plasma cell's operating conditions, can avoid material fatigue, even over large numbers of cycles and in the presence of large, fluctuating electric fields. However, other implementations only use physically-adaptive mechanisms, such as changing the gap between electrodes or moving a dielectric material between electrodes, in a low frequency mode when a reconfiguration is needed in response to a change of operating conditions such as a change in flow rate, ambient temperature or pressure; this can provide a low-frequency adaptation that can be used in combination with a dynamic feedback control mechanism, such as adaptation of the excitation frequency and/or excitation voltage. This combination can provide real-time adaptation across a wide range of operating conditions, as long as the physical build of the plasma cell has the flexibility to allow such movements to occur. It is also possible to adapt the dielectric properties between the electrodes and the plasma cell in real time, for example, through pressure, fluidic exchange or other appropriate means.

Adapting the gas sample pressure and/or flow rate could be used to maintain a defined plasma current profile, using corrective terms for the changes due to the change in molecular density within the gas and/or transit time in the plasma cell, if quantitative species information is required.

Adapting the energy given to the gas molecules by suitable means such as through heating or cooling using a heater, Peltier or other suitable means, or optical or radiative pre-excitation, prior to entry to the chamber may be used as means to stabilise the plasma current. These methods may be used in continuous or variable fashion or a combination of both.

The output by-products from the plasma may be used for plasma etching and/or surface cleaning and/or chemical production purposes. The optical output may be used for speciation and/or quantification of gas species and/or as an optical source. A feedback parameter or feedback parameters may be used for speciation and/or quantification within a gas mixture. In addition, a combination of one or more of these functions may be used.

In one example apparatus, the plasma cell is driven by at least one pair of electrodes, which are separated by a defined distance, through dielectric barriers such as ceramic, glass or quartz on opposite sides of the cell and the gap of the interior of the plasma cell, which forms a channel though which the gas of interest flows and within which the plasma is formed. At least one inlet and at least one outlet are provided to allow entrance and exit of the gas of interest. The electrodes are typically connected to the dielectric barrier by mechanical and/or adhesive means. More than one pair of electrodes may be desirable, for example, if an extended region of glow plasma is required. The size and shape of the electrodes are important in some example applications, since they define the plasma region extension and shape.

Example electrodes are provided with defined discontinuities in the electrode construction, such as in a mesh or lattice-like construction with round, square or other defined shape gaps. Nevertheless, electrodes with continuous surface construction may be used and are easier to design and assemble and will have higher capacitance for the same external size. A lattice-like electrode construction can lower the high current densities associated with filamentary formation and may also allow the use of optical detectors behind the electrodes measuring light through the holes in the electrodes. Identical, planar, continuous, circular electrodes may advantageously be used, due to the symmetry giving no intrinsic bias to encourage localisation of any plasma instability (breakdown). However, other shapes are possible and potentially advantageous, in particular mechanical and flow configurations.

Thanks to the enhanced stability that is achievable using methods and apparatus described herein, a wider range of electrode designs can be practically implemented. Likewise, the electrodes' shapes can be chosen to modify the profile of the plasma region formed and this may be useful to optimise the plasma geometry for particular flow regimes and/or optical emission or collection designs.

The area of the electrodes will affect the plasma cross sectional area and hence the amount of light emitted, with a larger area increasing the emitted light accordingly, although this will be at the expense of higher input power. Additionally, larger surface area electrodes will increase the capacitance of the system and, as is described below and illustrated in the accompanying drawings, this will enable enhanced current feedback and hence increased performance. Ideally, the electrical and mechanical properties of the dielectric and hence also the impedance and capacitive properties of the dielectric barriers are stable with time for optimal operational stability. In addition, the material and electrical properties of the dielectric are relevant factors when deciding the optimal thickness of the dielectric barriers. If the dielectric barriers are too thin, the current limiting properties may be insufficient, and if the barriers are too thick, an increased voltage will be required to penetrate the barrier. The voltage gradient across the gap is a control factor when inducing the plasma initiation and maintenance. For a fixed voltage, the smaller the gap, the larger will be the voltage gradient. This means that a small gap will enable the use of a lower voltage to induce a plasma in comparison with a large gap to induce the same voltage gradient. This is a consideration when attempting to initiate plasma in high ionisation energy gases such as nitrogen. A lower voltage can also have advantages for electrical safety design, easier transformer build requirement (fewer turns) and lower power usage. Additionally, a small gap will create a larger capacitance, which will enable more sensitive current feedback and enhance sensitivity, especially in non-optical detection mode. There is a practical limit to the size of the gap used because, as the gap becomes smaller, there will be a larger pressure drop across the cell and, especially if using the emitted light, the optical output may become very low. A compromise gap size is therefore used, which takes account of the above-mentioned factors, as well as manufacturability and cost. In some examples, insulation is provided around the electrodes (encapsulation) to avoid corona discharge formation.

If optical output or optical measurement is required, at least one window or optical element is present in the cell, transparent to the wavelength range of the light of interest (typically in the ultraviolet and visible parts of the electromagnetic spectrum). If an optical output is required as a light source or for optical analysis, there may be optical elements such as windows, optical filters (neutral density, band pass, high pass, low pass etc.), optical fibres, lenses, mirrors, diffraction gratings or spectrometers attached to the cell or associated with the output from the cell, to direct the light towards a particular destination or destinations or to modify the optical output in some way. These optical elements should be photostable to ultraviolet and visible light and also not luminesce in the wavelength range of interest as a consequence of photon absorption. Optical fibres may be useful in transferring the optical output to a non-line-of-sight destination and/or from a hot region containing the plasma cell to a cooler region where the electronics can operate within their operational ambient temperature limits. Additionally, fibre optics allow the siting of the detector and/or signal processing electronics at a distance away from the plasma cell and the high associated electromagnetic fields.

For gas detection, the output light may be detected by detectors such as photodetectors (e.g. silicon or InGaAs photodiodes), or thermal based detectors (e.g. pyroelectric detectors, bolometers or thermopiles) or, alternatively, the output light may be collected by a spectrometer, which creates a spectral plot across an emission wavelength range. The changes of intensities of emission lines with gas composition may be used for speciation and quantification. In the case of using the optical output as a light source, the output will have a unique optical spectrum dependent on the gas composition and operation parameters and may be suitable for specific spectroscopic applications, such as those involving absorption of the light or excitation within a secondary gas cell. Plasma by-products are present in the exhaust from the cell. These may be useful for plasma surface etching, cleaning, chemical production or other purposes. The by-products may also contain hazardous gaseous species, which may require appropriate treatment or consideration. The amount of plasma by-products produced and present in the exiting gas will be dependent on the gas composition, pressure, flow rate, cell size and electrode area amongst other factors.

Figure 2:
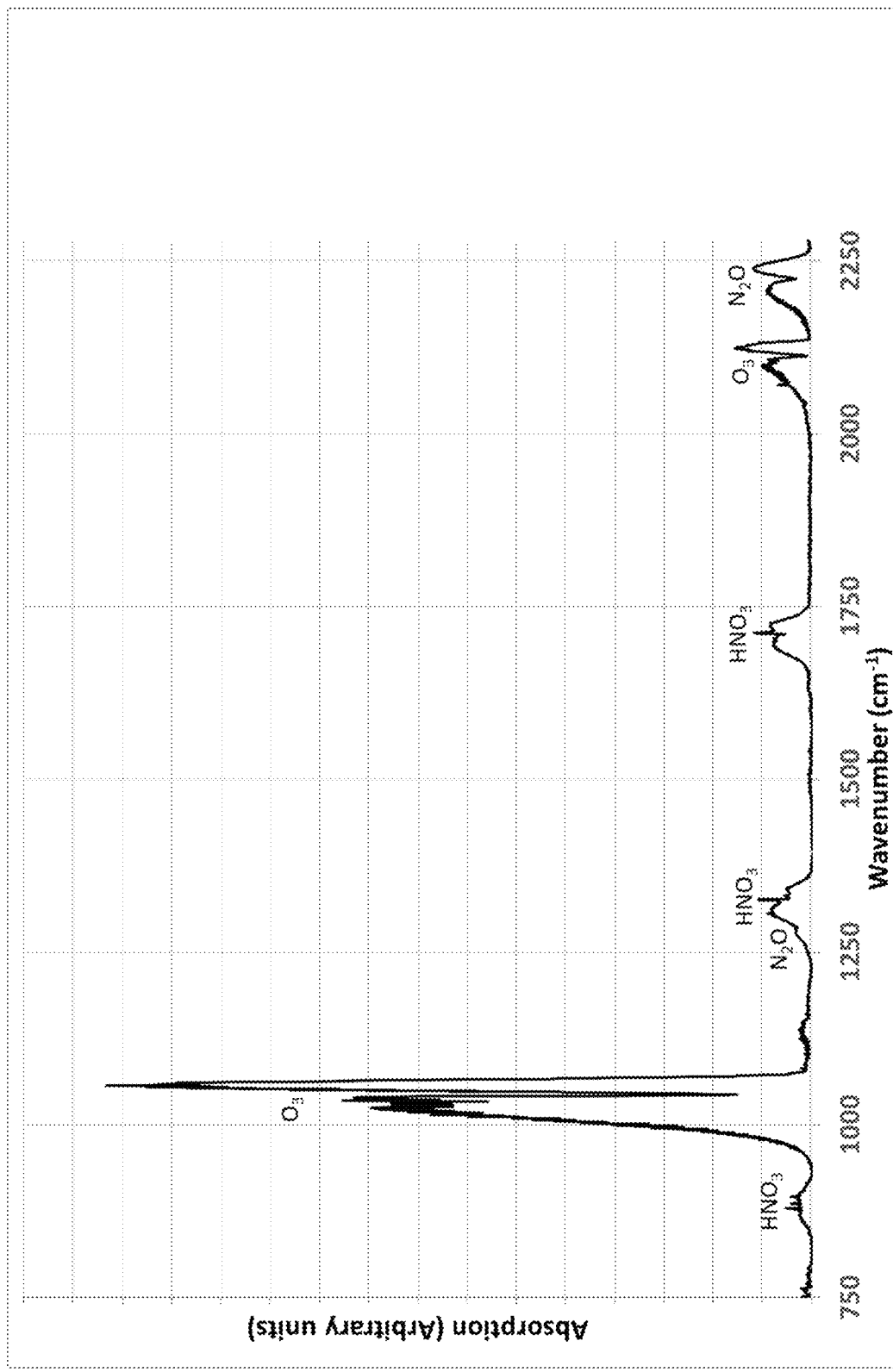
FIG. 2 is a spectral illustration of the exhaust by-products of an example apparatus.

All materials used to hold or encapsulate the plasma cell should be photostable to ultraviolet and visible light and also not luminescence within the wavelength range of interest as a consequence of photon absorption. Additionally, electromagnetic shielding may be useful to shield or contain the plasma cell and/or associated electronics from internal or external sources of electromagnetic interferences. Although the device has been described advantageously as being able to function at atmospheric pressure or higher, it may be desirable, in some circumstances, to operate at sub-atmospheric pressures, for example, to lower the required initiation and maintenance voltage and/or operational power or to lower the density of harmful by-products. Analysis of the plasma cell by-products shows consistency with the expected interactions among the species present in the generated plasma. This is illustrated in FIG. 2, which is a spectral illustration of plasma cell exhaust by-products, using data obtained from FTIR (Fourier Transform Infrared) absorption compositional analysis of the plasma exhaust gas from an example system embodiment. This was from a mixture of oxygen in a nitrogen plasma background, at atmospheric pressure, where a trace amount of moisture was present. It can be seen that ozone is the primary chemical by-product species formed from the oxygen in plasma as might be expected, as well as other secondary by-products involving nitrogen and oxygen.

In some embodiments, the plasma cell may be maintained at a defined, fixed temperature. This may prevent condensation and enhance plasma stability. In addition, the gas sample entering the cell may be maintained at a defined, fixed temperature. This has the advantages of increasing the thermal stability of the gas entering the cell, hence stabilising the output and lowering the voltage required to strike and maintain the plasma through the decrease in density, when held at higher than ambient temperature and with the addition of thermal energy to the gas sample. However, both of these options involve increased power for the heating. For optimal stability, the flow rate through the plasma cell should also be maintained at a defined, fixed flow rate through suitable flow control means, such as a flow controller.

Embodiments may also be designed to add one or more dopants to the gas sample prior to plasma entry. For example, trace amounts of water may be added for signal processing reasons, as described in U.S. Pat. No. 8,239,171.

A dielectric barrier discharge (DBD) is a form of discharge in which both electrodes of the at least one pair are in contact with a dielectric material. This dielectric layer acts as a current limiter. Under certain conditions, a unique type of discharge mode in DBDs is present, where the discharge appears as a diffuse glow, covering the entire electrode surface uniformly. Gas pre-ionisation by electrons and metastable species from previous discharges and the interaction between the plasma and the dielectric surfaces play important roles in the formation of this diffuse glow mode. The shape, size and separation of the electrodes, as well as the properties and thickness of any dielectric barrier between the electrodes and the plasma will be crucial to determining the optimal plasma field in glow discharge mode. Although, in principle, the electrodes could be in direct contact with the gas to be measured, in practice, a first example has electrodes protected by a dielectric barrier (e.g. glass or ceramic or any dielectric that can withstand high temperatures and high electromagnetic fields). Additionally, depending on the gases to be measured, there may be aggressive, corrosive components present (e.g. free radicals, ionised molecules and/or chemically corrosive gases/by-products) and, therefore, the dielectric surface must be corrosion resistant in these circumstances. The use of a dielectric barrier protects the electrodes but precludes the use of a high voltage DC field.

Use of an AC field for a DBD plasma means that the waveform, frequency and amplitude are important parameters for the stability of any glow plasma to be achieved. When the plasma is used for gas analysis, the signal generated by the plasma when the measurand(s) is (are) present may be determined by, for example, optical detection (for example with a passband filter (wavelength selection) and optical (silicon) detector), which may be in the ultraviolet and/or visible light spectrum. The intensity of emitted light at an individual passband is indicative of the measurand speciation and concentration. This requirement means that there must be, in this optical range, at least one transparent window or optical element within the plasma gas cell for this type of gas detection. Non-optical measurement techniques for gas analysis according to the present disclosure are discussed in greater detail below.

A known drawback of a typical DBD plasma at atmospheric pressure is described below.

Applying an external AC high voltage to the electrodes causes the discharge to initiate when the voltage across the gas gap rises above the breakdown voltage. The breakdown of the gas in the gap causes a plasma to be formed and the electrode current rises rapidly. In many conventional DBDs, this uncontrolled rise in plasma current can lead to the formation of filamentary discharges in this phase. This is characterised by a fast change in filamentary channel resistance, as a rapidly growing space charge forms a self-propagating streamer. Charged particles produced in the plasma accumulate on the dielectric surfaces adjacent to the electrodes, creating an electric field opposing the applied field. This causes a decrease in the net electric field across the gap and, therefore, the plasma current diminishes rapidly. Charges remaining on the dielectric surfaces, after the filamentary discharge ends, produce a residual electric field ready for the next cycle of the field which further contribute to diminishing the plasma current.

In order to achieve a stable glow plasma, the plasma current is controlled to avoid the formation of filamentary discharge which can lead to collapse of the plasma.

Two processes contribute to filamentary discharge as gas pressure in a plasma cell increases. Firstly, the collision rate between electrons and neutral molecules increases, thus producing an avalanche of energetic UV photons and charged species, which can develop more rapidly and more easily into filaments. Secondly, due to low diffusion rates at atmospheric pressure, the transverse particle diffusion process is restricted, thus encouraging arc discharges or filamentary glow to occur.

In optical emission spectroscopy, the presence of filamentary discharges during each half cycle can lead to undesirably noisy signals at the optical or non-optical detector. Additionally, over long periods of time, filamentary discharge will erode surfaces, such as quartz, of the dielectric barrier which in turn leads to measurement drift and ultimate failure of the dielectric barrier.

Avoiding filamentary discharges is therefore desirable for a number of reasons.

Figure 3:
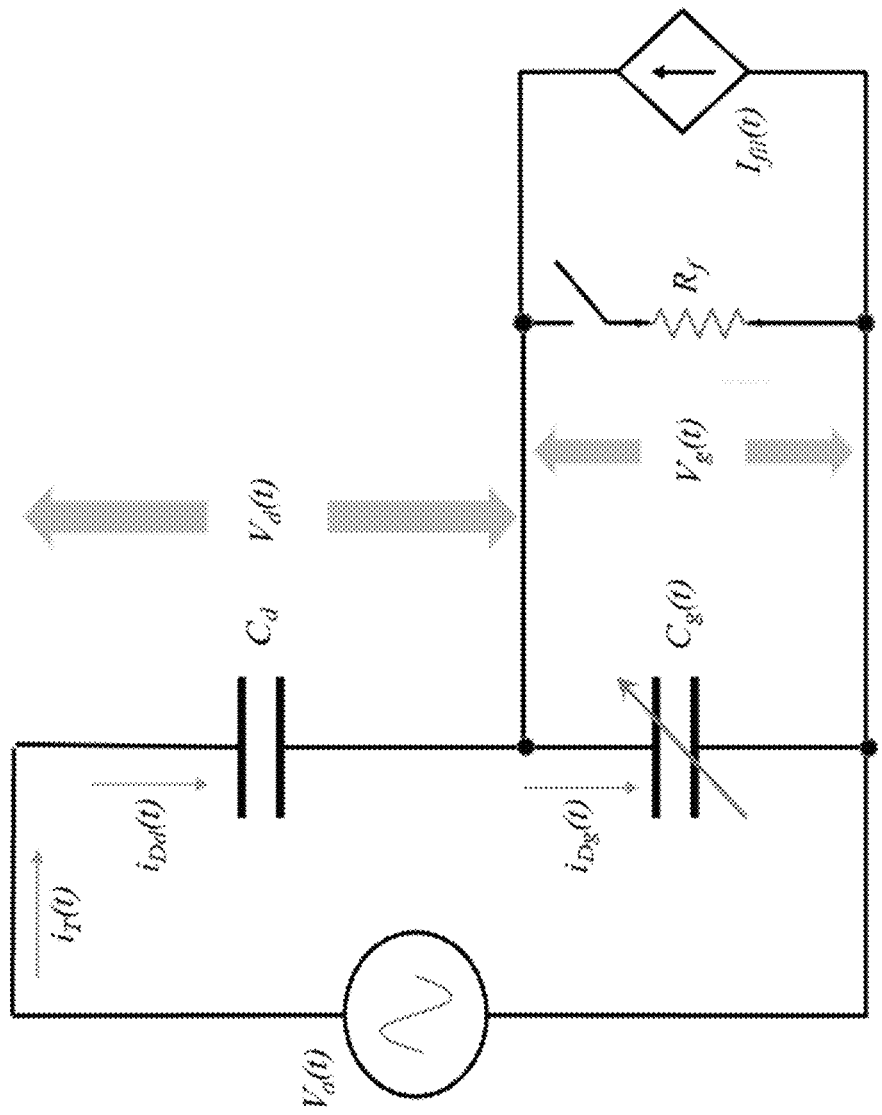
FIG. 3 is a schematic representation of the electrical model of a DBD plasma.

FIG. 3 illustrates a simplified electrical model representative of a DBD plasma. In this model, the DBD consists of two capacitors connected in series. One represents the capacitance of the dielectric barrier ($C_d$) and the other represents the capacitance of the gap ($C_g(t)$). The gap capacitance is highly dynamic and is represented as a time dependent variable capacitor. These capacitances can be estimated, knowing the geometry of the DBD cell and the composition and thickness of the dielectric material and/or the gap layers. $V_a(t)$ is the applied RF voltage, $i_T(t)$ is the total current of the DBD, $i_{Dd}(t)$ is the displacement current in the dielectric barrier, $V_d(t)$ is the voltage in the dielectric material, $V_g(t)$ is the voltage in the gap, $i_{Dg}(t)$ is the displacement current in the gap, $R_f$ represents the filamentary channel resistance, and $i_{fil}(t)$ is the current source representing the filamentary discharges.

If the applied plasma RF drive voltage $V_a(t)$ has a sinusoidal waveform, its mathematical expression is $V_a(t) = A \cdot \sin(\omega t)$, where A is the maximum amplitude of the applied voltage and $\omega$ is the operating frequency in rad/sec. The breakdown in the gap occurs when the applied voltage reaches the plasma breakdown voltage ($V_{bd}$) which depends on the operating frequency, the relative permittivity of dielectric materials, the gas, and the gap length used. As charges accumulate on the dielectric surface, voltage in the dielectric material $V_d(t)$ rises and a dielectric electric field opposes the applied electric field which can cause the plasma current to diminish.

Near a peak of the waveform of the applied voltage $V_a(t)$, extinction of the discharges takes place, where the rate of change of the applied voltage is close to zero ($dV_a(t)/dt=0$). These conditions are repeated for each semi-period of the applied voltage FIG. 3 illustrates the relationship between filamentary discharges and an illustrative sine waveform of the applied voltage.

Figure 4:
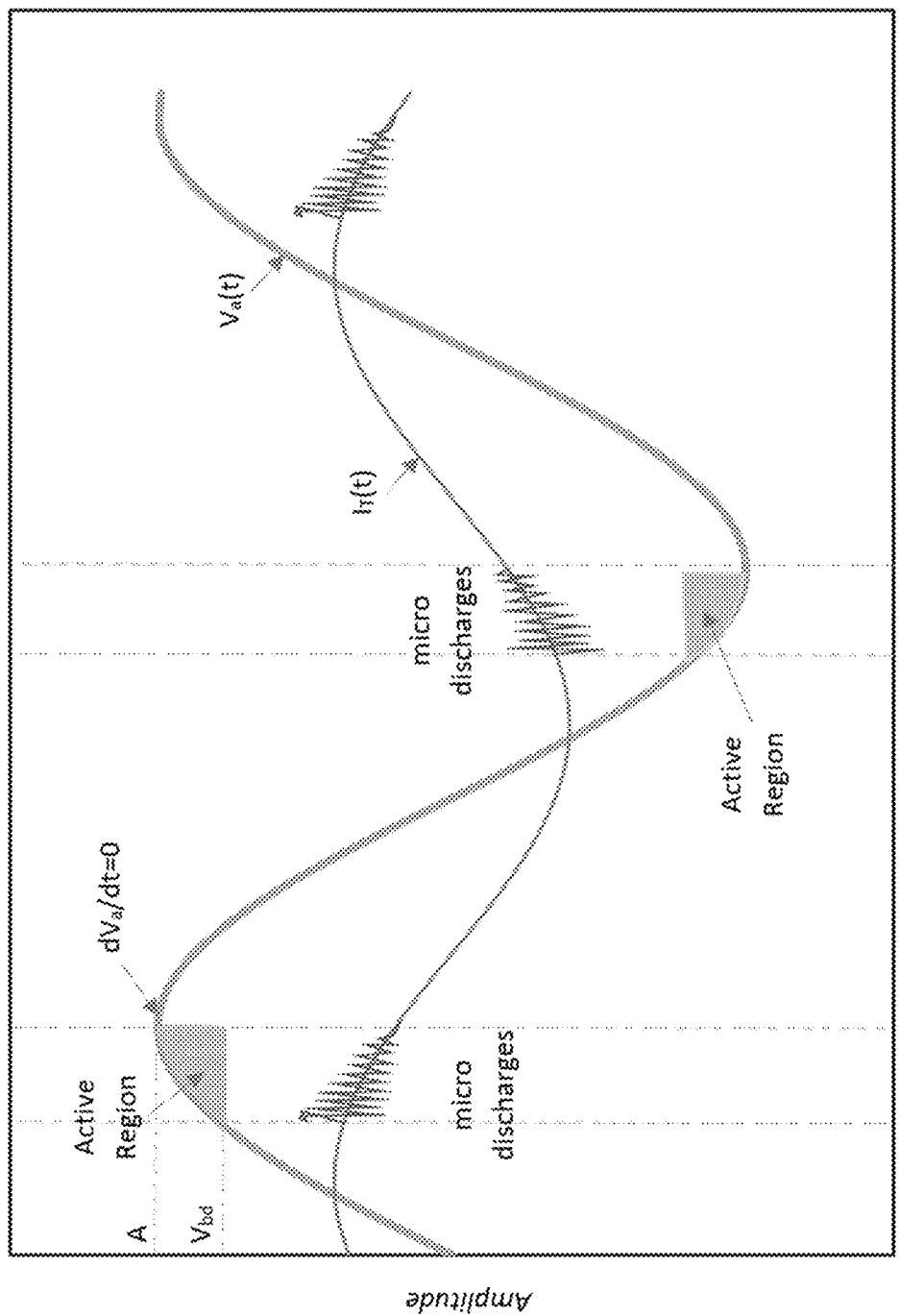
FIG. 4 is a graphical representation of plasma voltage and current during an excitation cycle.

FIG. 4 illustrates details of the voltage and current waveforms during ignition and extinction conditions i.e. the beginning and end of an "active region" in which filamentary discharge (micro discharge) is ignited and becomes extinct. Although filament-free or diffuse glow plasmas have been reported at low pressures, it is evident, from the above text and graph, that sustaining a diffuse glow plasma at atmospheric pressure (ambient air and pressure) is a challenge.

As indicated in FIG. 4, the plasma current waveform in resonance provides a means of detecting the presence of the filamentary discharges during each half cycle. Therefore, by implementing active control of the plasma current at resonance it is possible to avoid the uncontrollable rise in plasma current seen in conventional DBDs, and the formation of undesirable filaments can be controlled or mitigated. Such a control of the plasma current is performed on a cycle-by-cycle basis (i.e. during each excitation cycle of the alternating excitation voltage) with a reasonably high bandwidth.

Another important parameter of the DBD plasma operation, according to one example, is the frequency of its RF excitation. When the excitation frequency is too low, electrons and charged species on the dielectric surfaces accumulate too quickly and the opposing electric field ($V_d(t)$) overly suppresses the rise of the plasma voltage. Additionally, some recombination of discharge species on the boundary surface takes place. These effects, together, will result in either non-initiation or premature quenching of the plasma. Conversely, with too high excitation frequency, the electrons and charged species generated in the plasma bulk become confined within the inter-electrode gap and cannot reach the dielectric barrier surface to form the necessary opposing electric field. This will also lead to an unstable atmospheric DBD plasma. The solution is to control the excitation frequency to remain within the optimum (relatively narrow) frequency range over which the plasma is in a stable glow operation. This is referred to herein as the resonant frequency ($f_r$) band of the feedback system.

There is provided a resonant feedback control circuit that, during each cycle of an alternating excitation voltage, is able to actively adjust a voltage applied to electrodes on a cycle-by-cycle basis thereby controlling the plasma current and/or the excitation frequency, for example.

Resonant Current Feedback Control Circuit

Figure 5:
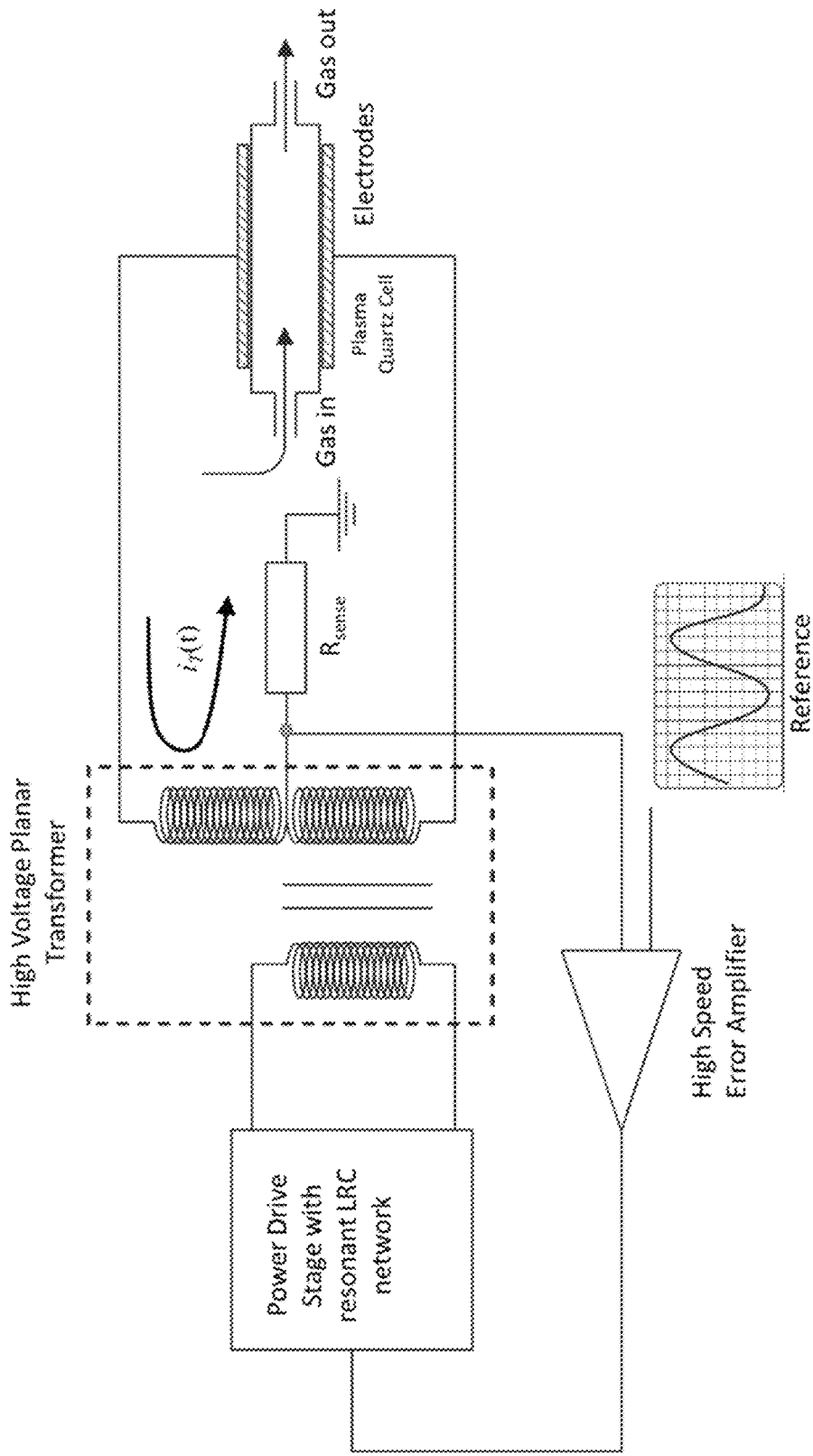
FIG. 5 is a schematic representation of components of a resonant current feedback control system for a plasma cell.

FIG. 5 illustrates an example implementation of the basic elements of a feedback circuit for plasma current control.

Plasma cell 500 allows formation of a plasma. The plasma cell is driven by at least one pair of electrodes 501 which are separated by a defined distance. Electrodes 501 are typically connected to a dielectric barrier (not shown) by mechanical and/or adhesive means. The distance provided between electrodes 501 forms a gap 502 in the interior of the plasma cell 500, where gap 502 in combination with gas inlet aperture 503 and gas outlet aperture 504 form a channel through which a gas of interest flow is able to flow through the plasma cell 500. A plasma is formed within gap 502 of the plasma cell 500.

A sense resistor 505 is provided as part of the feedback circuit to measure a signal across plasma cell 500 when electrodes 501 are provided with an alternating excitation voltage and a voltage gradient between electrodes 501 is generated. Sense resistor 505 is arranged to measure the signal induced across the plasma cell and an instantaneous plasma current $i_T(t)$ flows through sense resistor 505 and produces a sense voltage $V_s$ which is measured by a meter. Sense resistor 505 is connected to a secondary winding or coil of a high voltage transformer 506 at a point substantially halfway along the secondary winding or coil of the transformer 506 (centre-tap), allowing sense resistor 505 to be ground-referenced. A planar transformer is illustrated but transformer 506 is not limited to this. Transformer 506 is preferably a transformer with low winding capacitance and is discussed in greater detail below.

A connection between an amplifier 507 and sense resistor 505 is provided so that amplifier 507 receives the sense voltage $V_s$ signal from sense resistor 505 via a first amplifier input. A second amplifier input is provided to amplifier 507 so that amplifier 507 is able to receive a reference waveform 508 which can be used to set both the amplitude and frequency of a plasma current. The reference waveform may be provided from an oscilloscope, for example. A sinusoidal reference waveform is illustrated but other waveform profiles could be utilised such as a square wave, saw tooth, triangle or any other appropriate waveform or combinations of waveform.

Amplifier 507 is preferably a high speed amplifier capable of producing an error signal 509 which is proportional to a difference between reference waveform 508 and the actual plasma cell waveform detected by sense resistor 505.

Amplifier 507 provides error signal 509 to a power drive stage, or control unit, that has a resonant LCR network 510 that is used to drive a primary winding or coil of transformer 506.

The error signal drives the base of a complimentary high power NPN-PNP transistor push-pull configuration which in turn drives the primary side of the transformer through a fixed LCR network. The tight magnetic coupling between the secondary and primary windings of the planar transformer transfers this RF energy on a cycle-by-cycle basis to the secondary side which is in turn coupled directly to the plasma electrodes. Operating the whole system in resonance ensures that maximum energy is transferred to the plasma capacitance at each drive cycle.

The arrangement of FIG. 5 is only one implementation of a resonant current feedback control circuit, and other implementations could be used. As discussed, a planar transformer is not required but it can provide additional benefits that are discussed in greater detail below. There is no need for any high-voltage isolation circuitry for plasma current sensing, since any isolation circuit will adversely affect the bandwidth of such a comparison and will make it too slow to detect the onset of filament formation. The feedback circuit used is one that is able to cope with high speed feedback implementation.

According to the present feedback control circuit, a plasma current can be directly compared to a known reference waveform which can be used to control, or set, the amplitude and/or the frequency of the plasma current.

An alternating excitation voltage applied to electrodes 501 is adjusted, with reference to the reference waveform, on a cycle-by-cycle basis i.e. adjustment occurs based on a difference between a sense voltage $V_s$ measured from the plasma cell and the reference waveform during each cycle of the excitation voltage. Active adjustment of the voltage applied to electrodes 501 on a cycle-by-cycle basis is realised and the glow plasma may be stabilised over a wide range of changing conditions such as gas composition and/or ambient conditions. Adjustment of the voltage applied to electrodes 501 can compensate for the changing conditions so that the plasma can be stabilised during each cycle of the alternating excitation voltage i.e. in real time.

For example, on a cycle-by-cycle basis an excitation frequency of the excitation voltage can be measured and increased to avoid non-initiation or premature quenching of the plasma. Alternatively, the excitation frequency could be decreased to prevent confinement of electrons and charged species within the electrode gap, thereby allowing them to reach the dielectric barrier surface and form an opposing electric field. In other words, the excitation frequency can be controlled to remain within the optimum (relatively narrow) frequency range over which a plasma is in a stable glow operation.

Resonant Feedback Current Loop

Figure 6:
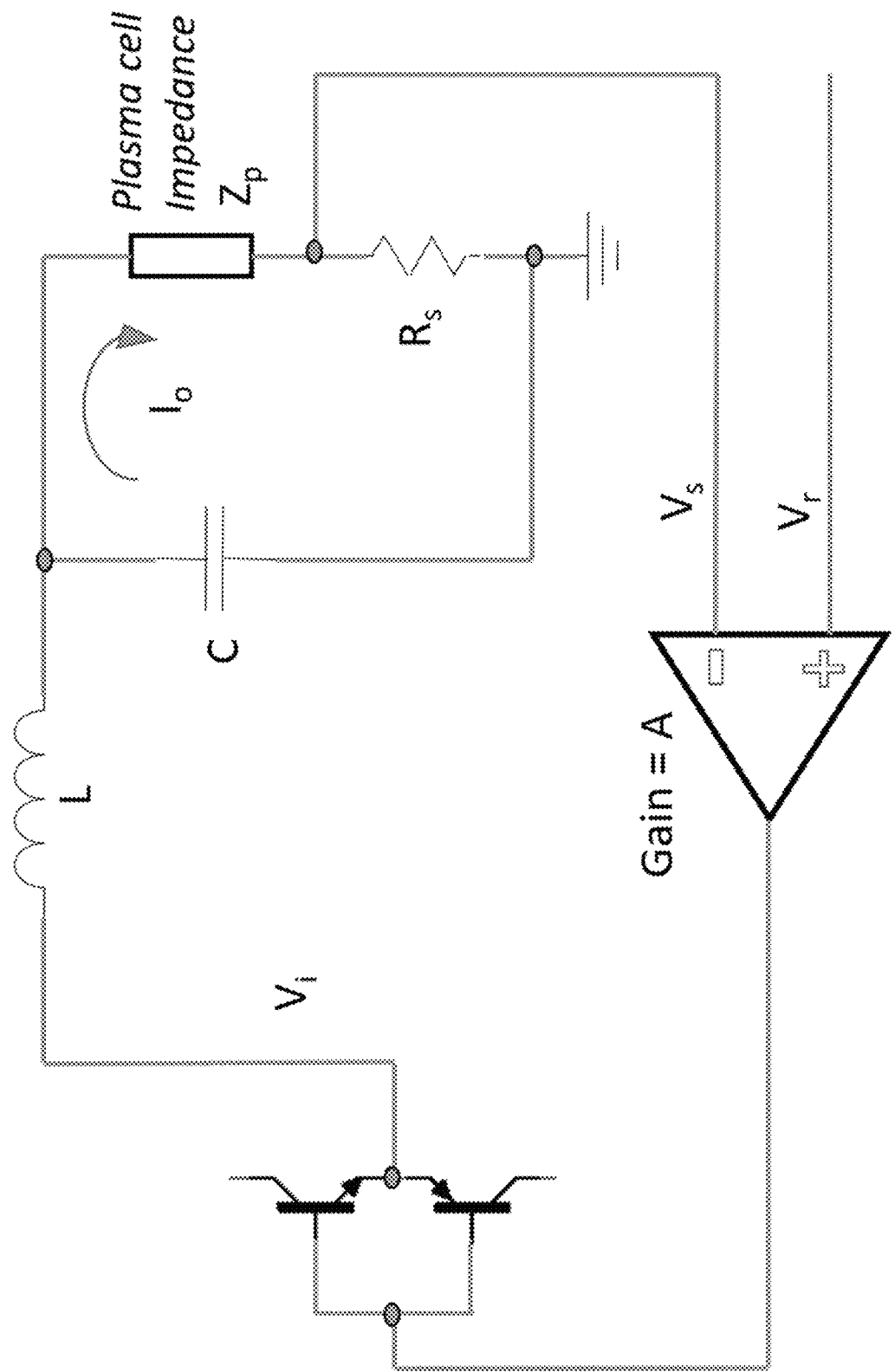
FIG. 6 provides a simplified representation of an electrical model of resonant current feedback control.

FIG. 6 illustrates a simplified representation of the series resonant plasma current feedback circuit of FIG. 5.

The effective impedance of the plasma cell transferred through the turns-ratio of transformer 506 is denoted as $Z_p$. Inductor L is the sum of the fixed inductor of the power drive stage's LCR network and the magnetising inductance of the transformer. Capacitor C is the sum of the effective plasma capacitance through the turns ratio of transformer 506 and the fixed capacitor of the power drive stage's LCR network.

The current $I_o$ flowing through the plasma impedance $Z_p$ sensed across the sense resistor 505 is shown as $R_s$. Feedback error amplifier with its associated effective gain A through the system is also illustrated.

Using node analysis, an expression for plasma current $I_o$ can be derived as a function of the feedback drive voltage $V_i$ and the circuit elements (sense resistor, transformer, amplifier and power source). Complex parameters $X_C$, $X_L$, and $Z_p$ used below are the impedances of C, L, and the load respectively. Under the conditions of resonance, with a frequency ($f_r$), the inductive and capacitive impedances of a series LC circuit, $X_L$ and $X_C$, are equal.

Equation 1 shows that, due to the high gain of the feedback error amplifier, the plasma current $I_o$ becomes approximately independent of the plasma impedance $Z_p$ and is controlled by the ratio of the reference voltage $V_r$ and sense resistor $R_s$.

Plasma control current $$I_o = \frac{X_c \cdot V_i}{X_c \cdot X_L + (R_s + Z_p) \cdot (X_c + X_L)}$$ Equation 1

$$I_o = \frac{X_c \cdot A \cdot (R_s \cdot I_o - V_r)}{X_c \cdot X_L + (R_s + Z_p) \cdot (X_c + X_L)}$$

$$f = \frac{1}{2\pi\sqrt{LC}} \quad X_C = -X_L$$

$$I_o = \frac{A \cdot (R_s \cdot I_o - V_r)}{X_L}$$

$$I_o = \frac{A \cdot V_r}{A \cdot R_s - X_L}$$

$$I_o = \frac{V_r}{R_s}$$

The above simplified analysis shows that the plasma current can be set by Vr and Rs, where Vr is the reference voltage waveform and $R_s$ is the sense resistor value which is a well-defined quantity. Provided the overall loop gain and bandwidth of the system are high enough, the plasma current can be controlled in a region of resonance making it independent of the plasma dynamic impedance $Z_p$.

Controlling the plasma current on a cycle-by-cycle basis at resonance has the very important property of stabilising the glow plasma so that it can be maintained over a wide range of compositional and ambient conditions. Formation of undesirable filamentary discharges can be mitigated and a DBD plasma is able to be operated at atmospheric pressure in a stable diffuse glow mode with low noise and low measurement drift.

Figure 7:
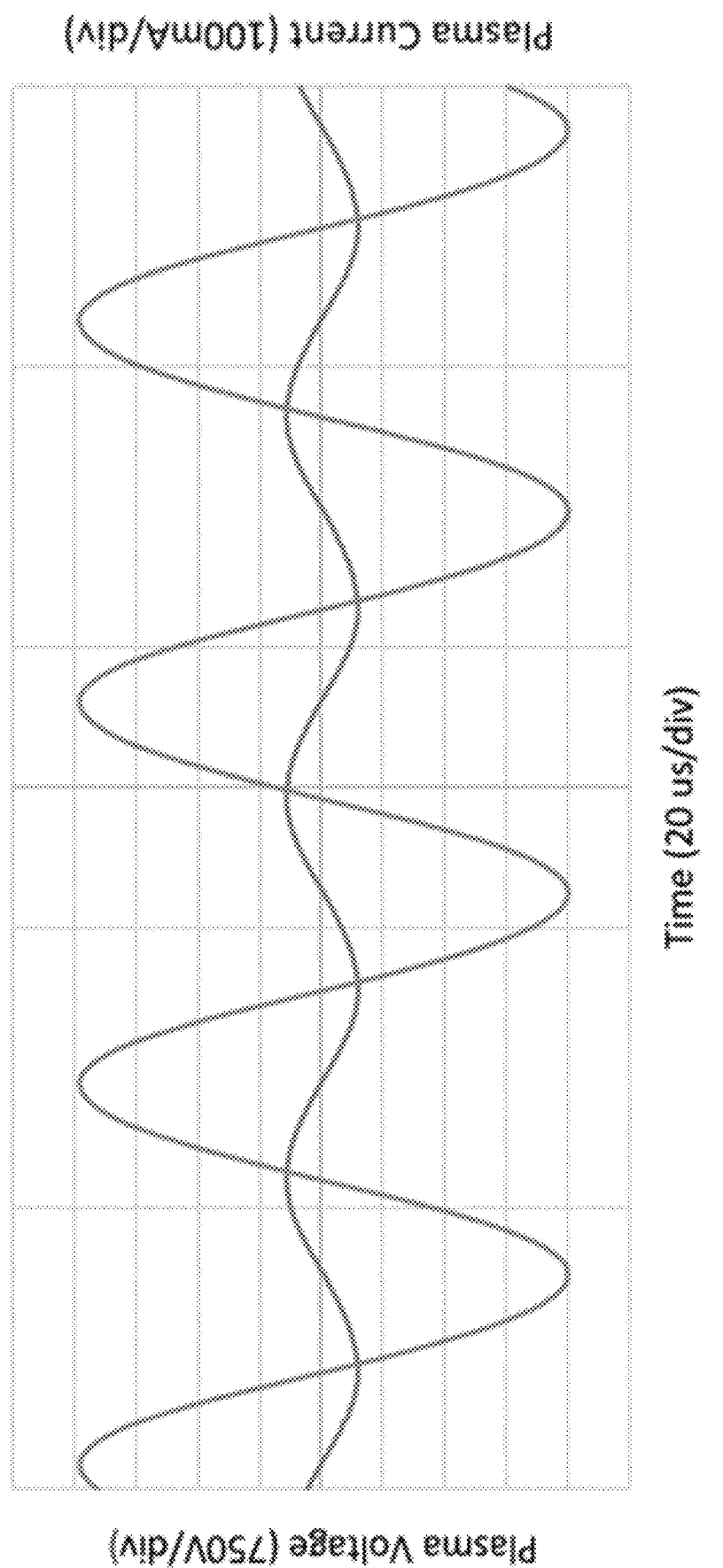
FIG. 7 provides a graphical representation of DBD plasma drive voltage against plasma current, plotted for an atmospheric $N_2$ glow plasma, using resonant current feedback control.

It is important to verify the above theoretical expectations with experimental results. As an illustration of a particular example solution, FIG. 7 shows a plot of the experimental plasma voltage and current in a 100% nitrogen plasma at atmospheric pressure with a flow rate of 500 ml/min, using resonant current feedback control. It is notable to observe the lack of filamentary discharges in the current waveform during the active phases of plasma excitation cycles. Note that these characteristics will vary dependent on design and working conditions. Further experimental results to verify the performance of the feedback circuit are provided below.

Advantages of Using a Transformer with Low Inter-Winding Capacitance

For optimal feedback correction, transformers with low winding capacitance should be used, since the current due to this capacitance will be included in the net measured plasma current. The inter-winding capacitance of transformer 506 will therefore be a contributing influence on the optimum drive frequency used for a stable plasma. A low winding capacitance in transformer 506 may be optimally achieved by using a planar transformer design.

For any feedback loop to function properly, it is important that the sensed parameter is a faithful representation of the actual process. For plasma current feedback, it is important that the current through sense resistor 505 is a faithful representation of the plasma instantaneous current only. Since the plasma cell can be represented as a bulk capacitor, any other stray circuit capacitances in contact with the DBD plasma cell can create spurious sources of current, which must be minimised.

However, in many practical applications, the inter-winding stray capacitance of the high-voltage transformer secondary windings can be high. This is due to the need for a very large number of secondary turns necessary to generate the high voltages necessary for ignition of an air or nitrogen plasma at atmospheric pressure. The compact size of these high frequency, ferrite-core transformers means that the wire windings are tightly coupled together leading to high inter-winding stray capacitance in many conventional Royer transformers. Additionally, the compact geometric size of the plasma cells used, for example, for optical emission spectroscopy, means that, very often, the inter-winding capacitance of the transformer can be of the same order of magnitude or even larger than the plasma bulk capacitance. The presence of this large stray capacitance is an important obstacle in achieving optimal cycle-by-cycle plasma current feedback control.

A traditional, wound transformer's tight geometrical wire coupling, where wires are wound in layers on top of each other, as shown in FIG. 8a, creates large inter-winding capacitances. Splitting the windings in sections, the so-called bank-winding, using a split or segmented bobbin, has been used traditionally, however, the stray capacitance remains high for large numbers of turns which is needed for high voltage generation.

Planar transformers (FIGS. 8b and 9) provide several significant advantages in relation to the winding capacitance compared to conventional winding methods as illustrated in FIG. 8a. Advantages of planar transformers will now be described.

Firstly, the large cross-sectional area of a planar ferrite core helps to reduce the number of primary and secondary turns for a given turns ratio at a given frequency.

Secondly, the segmenting of windings in successive layers of the PCB provides a natural separation of layers with thicknesses of insulating fibre-glass spacing the windings from each other.

Figure 9:
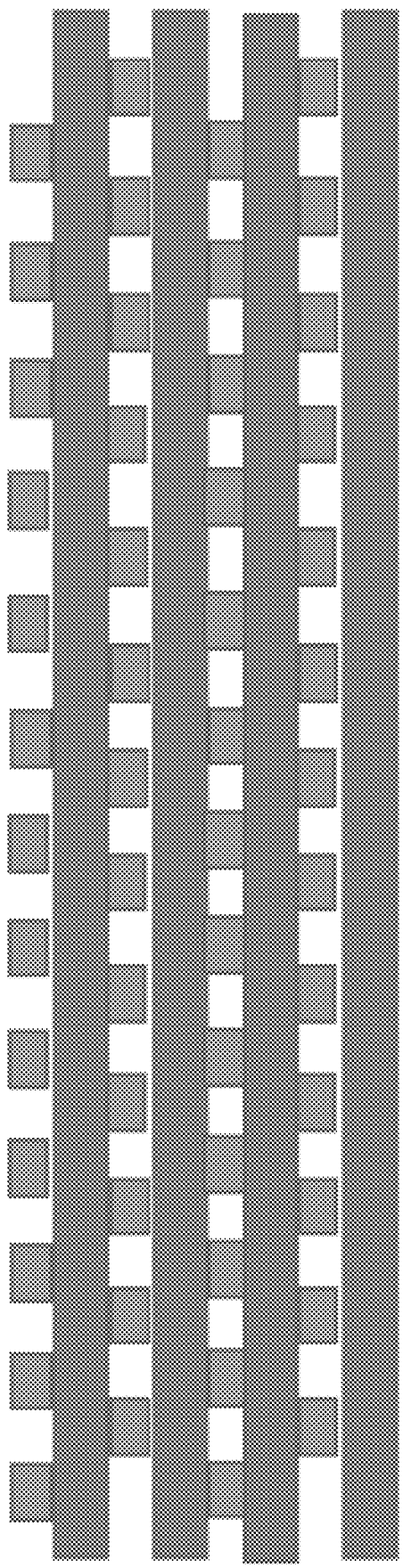
FIG. 9 represents a PCB winding structure in a low capacitance planar transformer.

Thirdly, when the tracks on opposing layers are laid out in a staggered formation as shown schematically in the staggered PCB windings structure diagram of FIG. 9, the windings will have an indirect geometric coupling, which helps to reduce the layer-to-layer capacitance significantly.

Fourthly, the use of a planar transformer has the practical advantage of being able to be easily setup at a centre-tap configuration. This configuration splits the secondary further winding into two quadrature windings allowing for a further significant reduction of inter-winding capacitance. For a bipolar drive method, the quadrature phasing of the centre-tap configuration means that, when one secondary winding is at its peak voltage, the other is at a zero-crossing point, which further enforces minimal coupling between the windings.

Accordingly, for optimal feedback correction, transformer 506 preferably has a low winding capacitance, and more preferably is a high voltage planar transformer with low inter-winding capacitance.

Experimental Results:

To verify the performance of the resonant current feedback plasma, a variety of experiments were performed, for illustration, with nitrogen as the background plasma gas. These experiments were focused on demonstrating the capabilities of the plasma feedback system in presence of high flow rates and wide variations of gas compositions. Additionally, they show the versatility of the feedback concept in a variety of applications, for example, its application to gas sensing using optical and non-optical means. Optical measurements are often used to illustrate the properties of the plasma.

High Concentrations of Oxygen in a Nitrogen Background Plasma at Atmospheric Conditions Nitrogen ($N_2$) and oxygen ($O_2$) gas mixtures were flowed through a quartz cell, with a pair of high voltage electrodes, a resonant plasma current feedback control circuit coupled to a planar high voltage transformer, a spectrometer and a PC used in analysing the emissions spectra and an oscilloscope to monitor both the plasma drive voltage and the current flowing through the plasma. In atmospheric pressure $N_2$ plasmas, electrons are accelerated by the electric field to a high kinetic energy level. The inelastic collisions of these energetic electrons with $N_2$ molecules result in the excitation and ionisation processes of $N_2$ molecules. The most intense emission lines of $N_2$ are observed between 300 and 400 nm. These are due to the $N_2$ Second Positive System ($N_2[C^3\Pi_u] \rightarrow N_2[B^3\Pi_g]$) and ($N_2[B^3\Pi] \rightarrow N_2[A^3\Pi_u]$) emission bands, with a dominant emission $N_2(0,0)$ band head at 337.1 nm. The population of the $N_2[C^3\Pi_u]$ excited state, which is typically at or above 11.1 eV, is caused by direct electron impact excitation from the ground state. The subsequent radiative decay to $N_2[B^3\Pi_g]$ state emits characteristic photons of second positive band head $N_2(0,0)$ with a wavelength of 337.1 nm.

Figure 10:
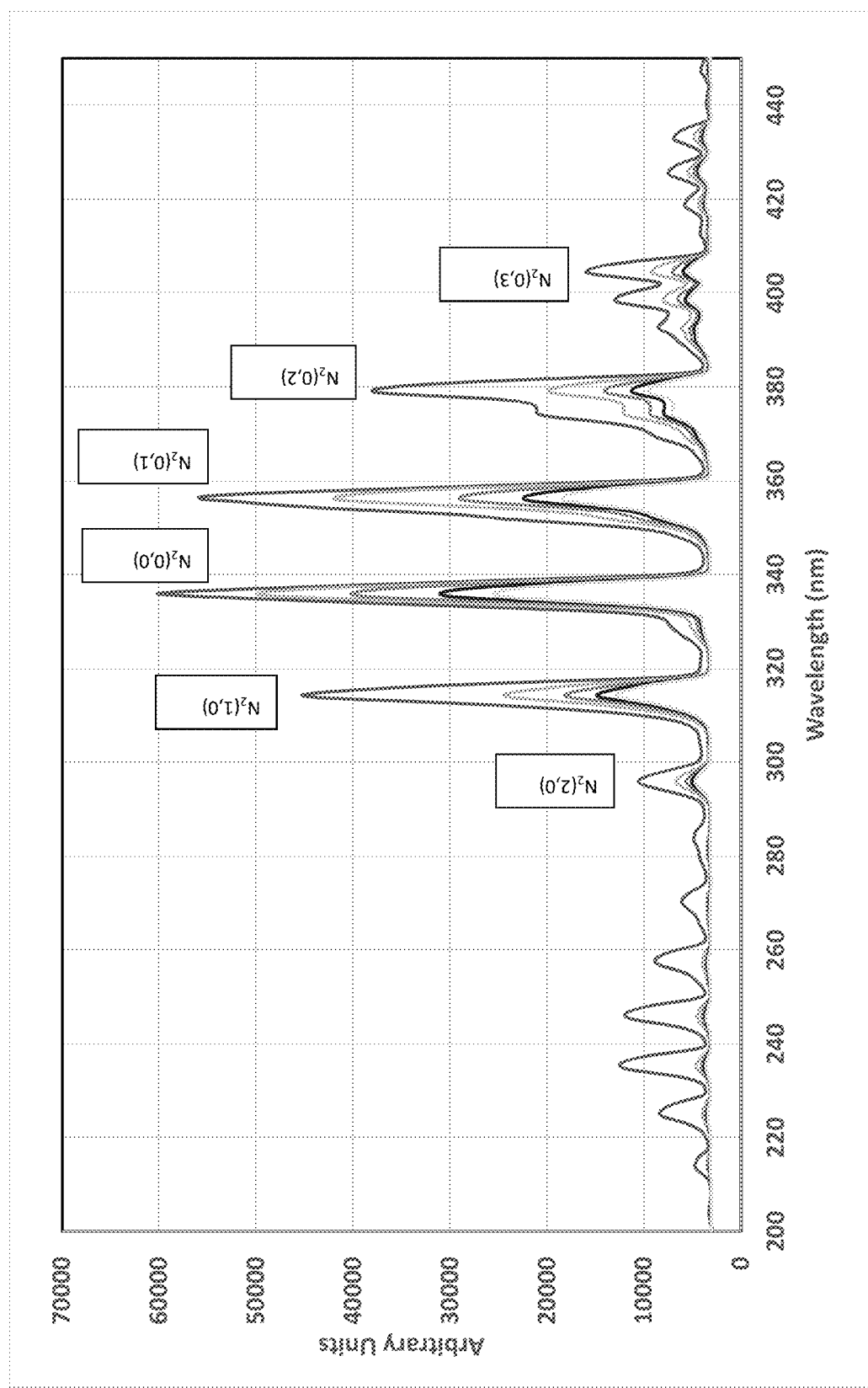
FIG. 10 is a graph showing an $N_2$ plasma optical spectrum with various concentrations of $O_2$ at atmospheric pressure.

FIG. 10 shows the actual spectrometer plots of the resonant current feedback plasma using $N_2$ as the background gas with $O_2$ as the measurand gas in varying concentrations at % levels and at a relatively high flow rate of 500 ml/min.

The plot shows that even in presence of high % levels of $O_2$ and the high flow rate, the plasma continues to operate in a stable glow mode. Strong quenching by $O_2$ is observed from the intensity of $N_2$ emission lines. The quenching effect of $O_2$ is particularly evident in the 200 nm to 300 nm UV band. Maintaining a stable glow plasma and providing a continuous spectroscopic measurement of the gas mix, even in the presence of such strong quenching, is of considerable practical importance in industrial applications where both $N_2$ and $O_2$ are present in high and varying concentrations such as in air separation applications.

Figure 11:
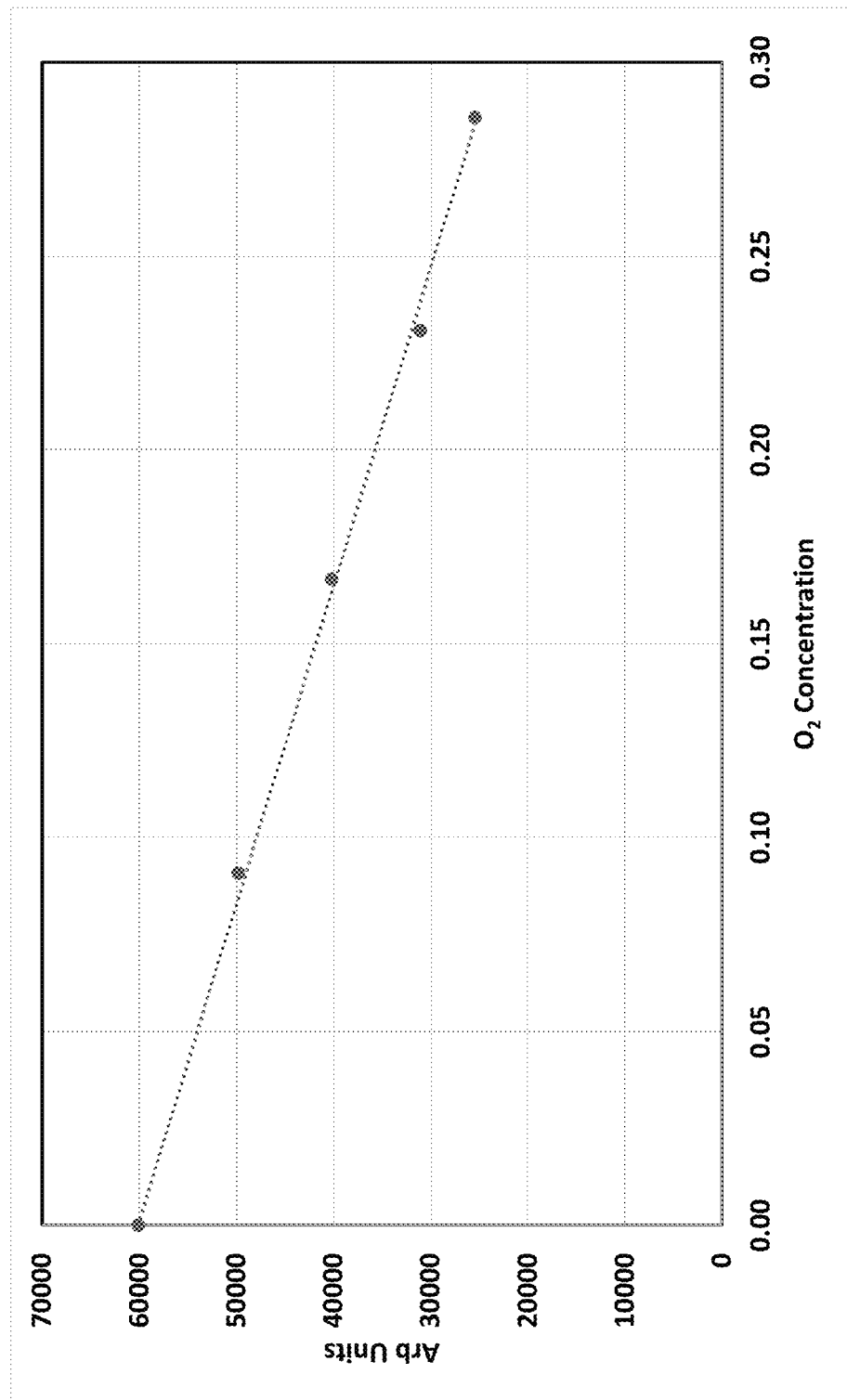
FIG. 11 is a graph showing an example emission line strength linearity with $O_2$ concentration.

FIG. 11 shows a practical linear response of the 337 nm line of $N_2$ as a function of $O_2$ concentration, although other emission lines could also be used. In addition to the above line, the presence of the atomic line of $O_2$ (O I) was noted in the experimental data at 777.2 nm which can be used to measure $O_2$ directly. The emission line of atomic $O_2$ triplet at 777.2 nm results from direct Penning ionisation of $O_2$ molecules followed by the electron-impact dissociation of $O_2+$.

Figure 12:
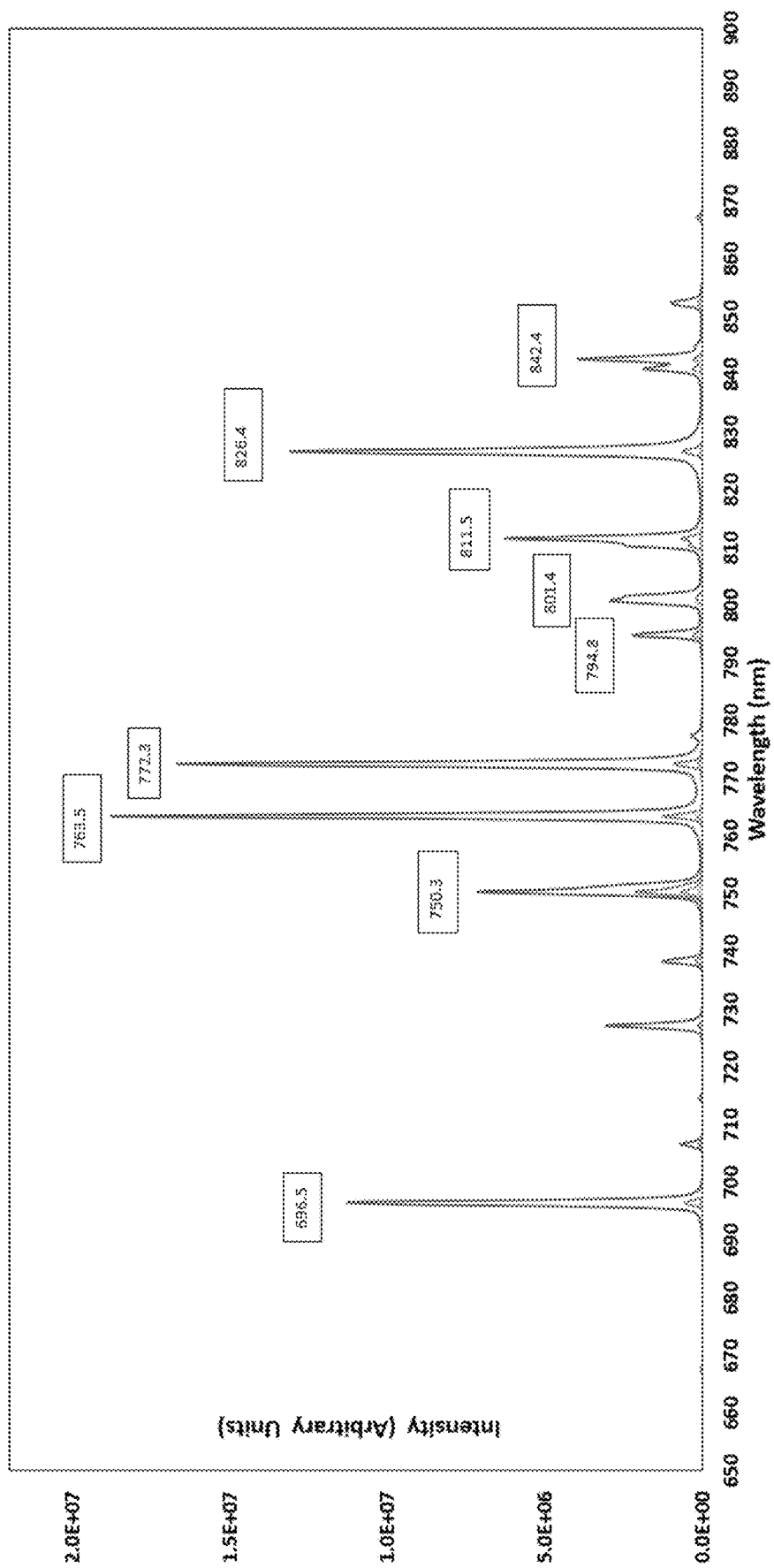
FIG. 12 is a graph showing an $N_2$ plasma optical spectrum with various concentrations of Argon.

High Concentrations of Argon in a Nitrogen Background Plasma at Atmospheric Conditions The same experimental setup was used to study the plasma performance when argon is used as the measurand gas in $N_2$ background. The gas blending was achieved at a net 500 ml/min flow rate. FIG. 12 shows the plot of argon emission bands obtained using the resonant current feedback method at varying argon concentrations from 0 to 100% with $N_2$ as the background gas at atmospheric pressure. There is an excellent agreement between the observed spectrometer wavelengths and the NIST Atomic Spectra Database for atomic argon. Metastable species play an important role in argon mixes and strong emissions from metastable atoms are predominant for argon. The optical emission comes mainly from the depopulation of the 4p levels via multiple 4p-4s transitions, which is the case for the well-known argon transition at $\lambda=750.387$ nm (Ar750).

| $\lambda$ (nm) | Transition | Rel. Intensity (a.u.) | $E_i$ (eV) | $E_f$ (eV) |
|---|---|---|---|---|
| 750.387 | $4p'^2[1/2]_0 \rightarrow 4s'^2[1/2]^0_1$ | 20000 | 13.48 | 11.83 |

Figure 13:
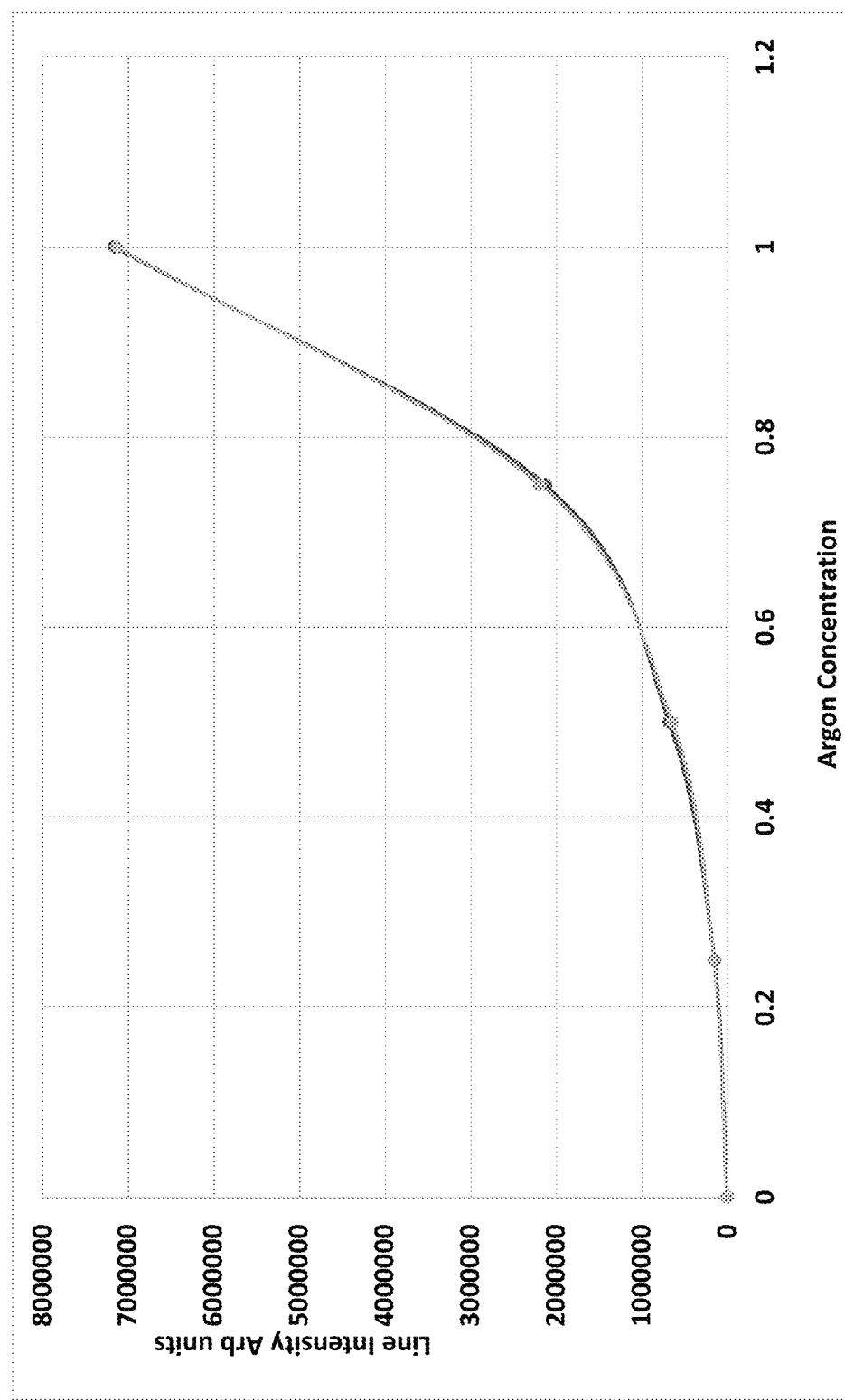
FIG. 13 is a graph showing line intensity versus argon concentration.

In a $N_2$—Ar plasma mix it is important to understand the cross-linkage among gas species as energy transfer among different plasma species can occur and is a dominant feature for plasma diagnostics. Argon has a lower ionisation energy than nitrogen, consequently, argon metastables transfer energy to nitrogen neutrals through non-radiative processes such as collision. Therefore, at the lower end of argon concentration, the intensity of Ar750 line grows slowly as energy transfer from argon to $N_2$ occurs. However, as argon concentration increases and $N_2$ concentration decreases, the Ar750 line strength picks up its pace. This important plasma kinetics is clearly visible in FIG. 13, which shows a near perfect exponential rise of Ar750 line strength with argon concentration. The mathematical model for this exponential relationship is in the form of:

$$y = A + Be^{Cx}$$

where x is the argon concentration and y is the emission line strength. Parameters A, B and C are coefficients of the mathematical model. Based on this simple model, the concentration of argon for a given Ar750 line strength can be calculated as:

$$x = \frac{\ln\frac{y-A}{B}}{C}$$

Figure 14:
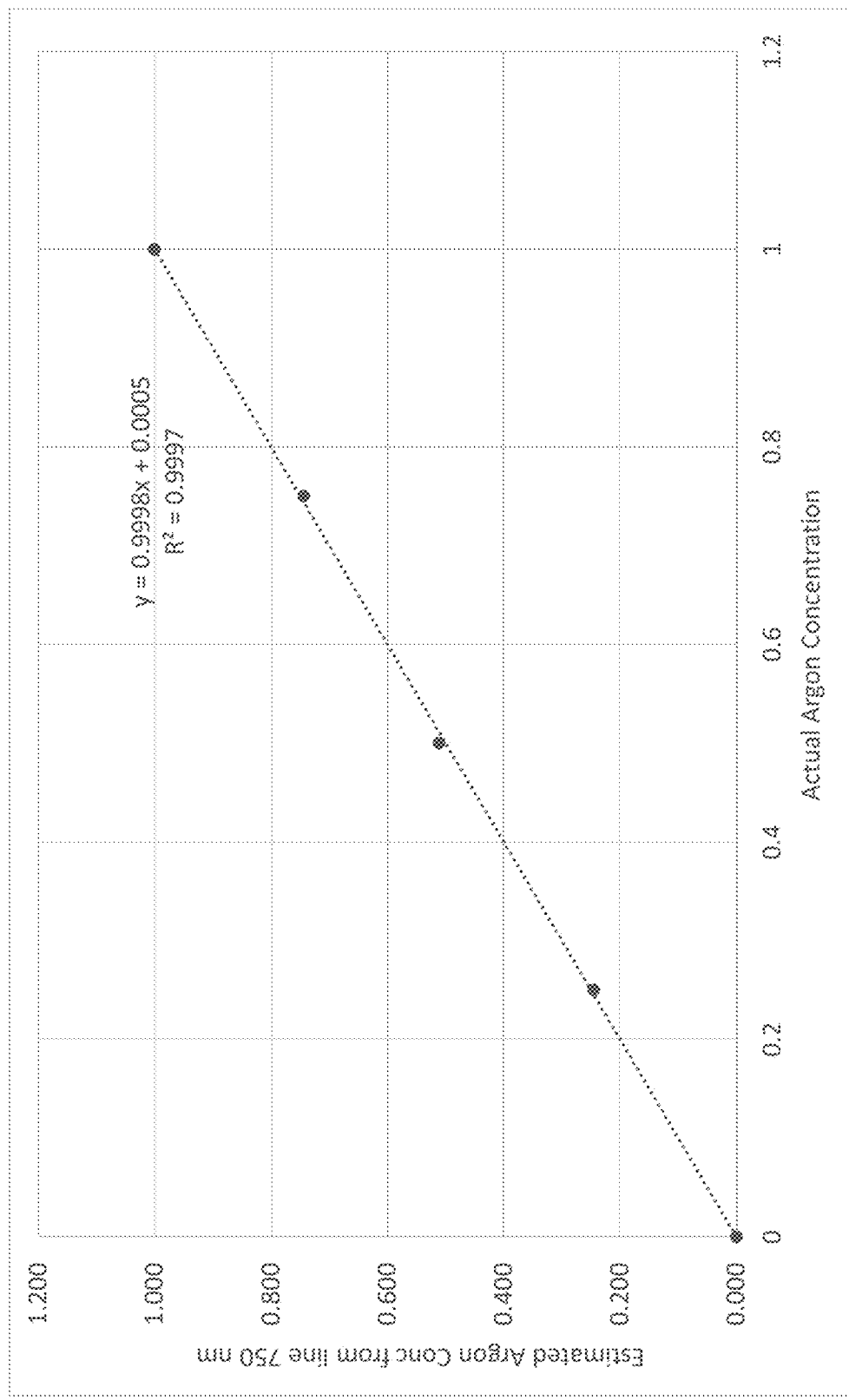
FIG. 14 is a graph showing an example of linearity of response to argon concentration.

Results for the experimental setup using the resonant current feedback N₂ plasma with varying levels of argon measurand are summarised in Table 1 below using coefficients from the exponential fit with a corresponding plot shown in FIG. 14. This shows linearity of response of the Ar750 line.

TABLE 1

Actual argon concentration versus estimated

| Fractional Argon Conc. | Calculated Argon Conc. |
|---|---|
| 0.00 | 0.00 |
| 0.25 | 0.25 |
| 0.50 | 0.51 |
| 0.75 | 0.74 |
| 1.00 | 1.00 |

Note that the emission lines produced by metastable de-excitation mean that the glow plasma could also be used as a source of wavelength specific ultraviolet and visible light.

Glow Plasma Gas Sensing Using Frequency Sweep

As described previously, an "open loop" plasma system may be subjected to wide variations of external conditions such as flow, gas concentrations, supply voltage fluctuations etc. Internally, an "open loop" plasma is also subjected to wild fluctuations of excited species densities during excitation and de-excitation cycles of the applied RF field leading to significant dynamic impedance variations evident in the formation of filaments. If no attempt is made to compensate for these changes, plasma stability will be compromised which will limit the usable breadth of applications of plasma in gas analysis. Using cycle-by-cycle resonant current feedback, it has been demonstrated both theoretically and experimentally that the impact of these "open loop" variations has been either eliminated or at least considerably reduced.

Similar to all other feedback systems, the actual amount of feedback signal used is an indication of the state of the system under control. In the case of the plasma resonant current feedback, changes in the strength of the cycle-by-cycle feedback signal at the high gain error amplifier is a direct indicator of the macroscopic impedance ($Z_p$) variations of the plasma cell. It is important to note that due to its high gain, the error amplifier feedback signal will greatly amplify and enhance these impedance changes making them usable as a measurement on its own. OES probes the plasma emission at its quantum mechanical level, however, the plasma complex impedance ($Z_p$) is a "macroscopic" measure of the plasma "bulk" properties. Introduction of a measurand gas into the background N₂ plasma will inevitably change its macroscopic impedance which should be visible as a change in the amplified feedback signal.

A common technique for measuring the impedance in the frequency domain is by applying a set of different excitation frequencies ($\omega$) to the system and recording the corresponding changes in the system's response. In this way a frequency spectrum ($Z_p(\omega)$) of the system's impedance is obtained. For a DBD plasma, the largest change in impedance will be due to the change in the capacitance of the gap ($C_g$), where the plasma bulk dielectric changes due to ionisation effects of gas concentration changes. For the resonant feedback system discussed in this patent, this change of plasma gap capacitance will be translated to the primary side through the turns ratio of the transformer and will cause a small shift in the resonant frequency of the feedback system ($\Delta\omega_r$). To predict the amount of this change, we denote the resonant frequency when plasma is fed by N₂ as $\omega_{rN2}$, and the small change in its resonant frequency as ($\Delta\omega_r$) due to a change in bulk capacitance $\Delta C$.

$$\omega_{rN2} = \frac{1}{\sqrt{LC_{N2}}}$$

$$\frac{\Delta\omega_r}{\Delta C} = \frac{-1}{2C_{N2}\sqrt{LC_{N2}}}$$

$$\frac{\Delta\omega_r}{\omega_{rN2}} = \frac{-\Delta C}{2C_{N2}} \text{ or }$$

$$\Delta\omega_r = const.(-\Delta C)$$

Therefore, for a small positive change in capacitance, the change in resonant frequency $\omega_r$ will be:
(a) Towards a lower resonant frequency ($\Delta\omega_r$ is negative).
(b) Will be linear with the change in plasma bulk gap capacitance $\Delta C$.

It is important to note that:
(a) Bulk capacitance changes will occur if a gas species contributes (e.g. argon and helium) to the ionisation and polarisation processes of the plasma bulk.
(b) Bulk capacitance changes will cease to occur if a gas species does not contribute or even quenches (such as O₂) ionisation and polarisation within the plasma bulk.

Figure 15:
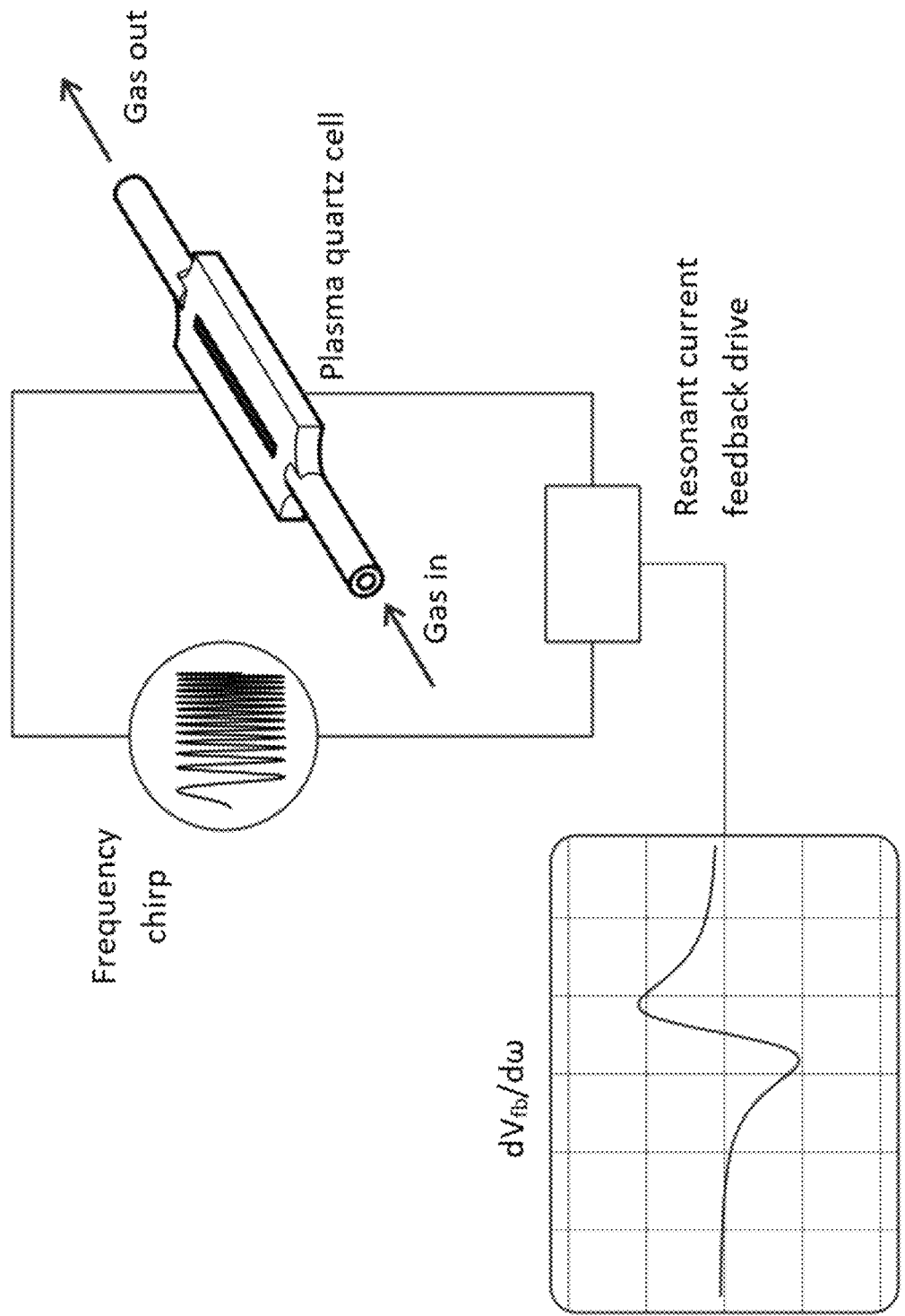
FIG. 15 is a schematic representation of components of an apparatus used to achieve resonant feedback control using a chirp excitation stimulus signal, with a representative feedback signal response.
Figure 16:
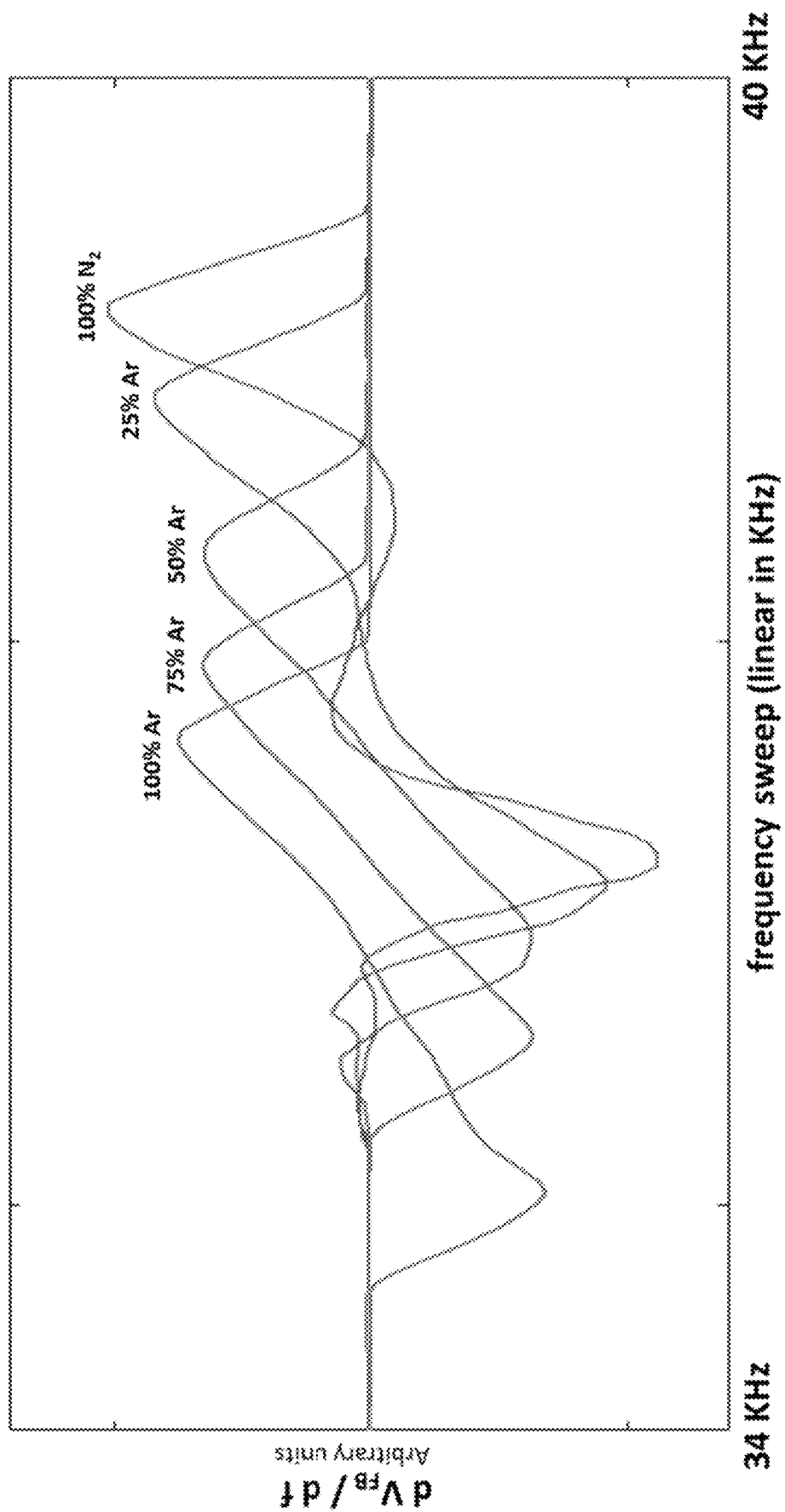
FIG. 16 is a graph showing a derivative of feedback voltage with increasing argon concentration in an $N_2$ background plasma, for a resonant current feedback system such as shown in FIG. 15.
Figure 17A:
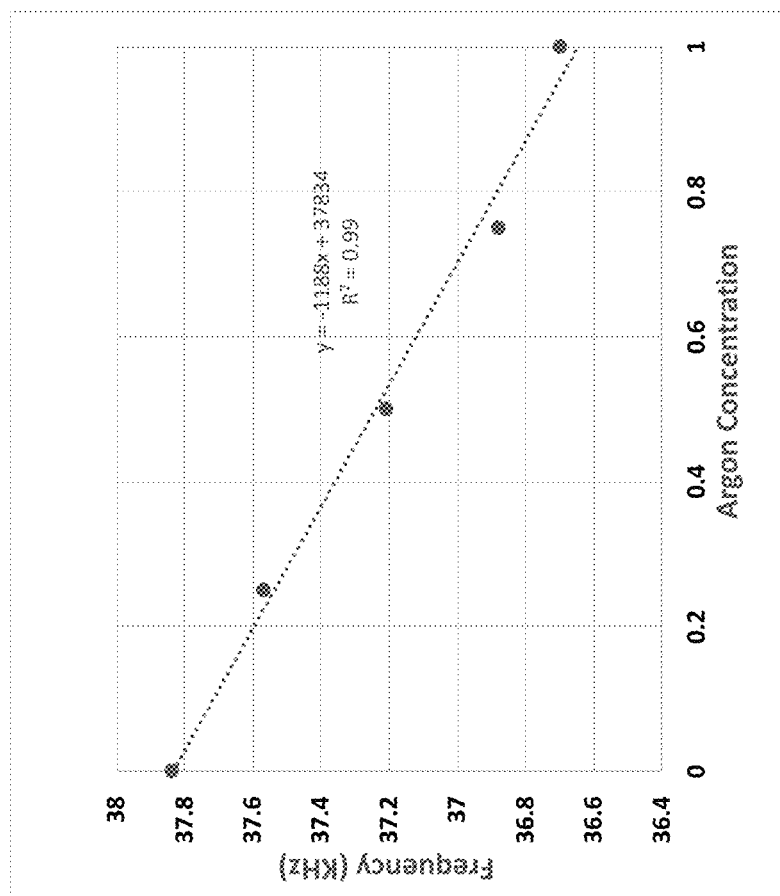
FIG. 17 provides two graphs, with FIG. 17a representing resonance peak frequency versus argon concentration for a feedback voltage resonance system and FIG. 17b showing plasma feedback voltage integrated area versus argon concentration for this feedback voltage resonance system.
Figure 17B:
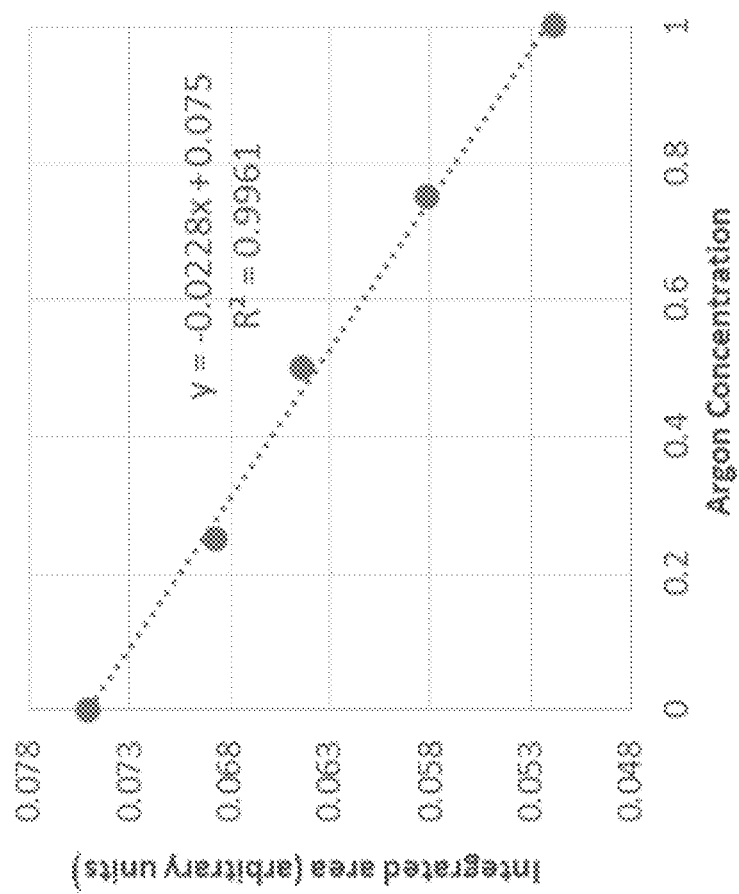

Experimental Results:

The same experimental setup was used to analyse the effect of adding argon at various concentrations from 0 to 100% to the N₂ background plasma. To obtain a frequency spectrum of the plasma impedance, the reference waveform ($V_r$) was programmed to have an example linear sweep of frequencies from $\omega_{low}$ ($2\pi f_{low}$) to $\omega_{hi}$ ($2\pi f_{hi}$), although profiles other than a linear sweep could be used, such as a logarithmic sweep. This is often referred to as a frequency chirp. When a frequency chirp is used, the chirp duration is ideally much faster than a typical plasma gas cell volume exchange time. The derivative of average feedback voltage ($V_{fb}$) highlights the positions of the peak resonance more easily than $V_{fb}$ itself, which could also be used, and is continuously monitored during this sweep, as shown schematically in FIG. 15. Results of consecutive sweeps as argon is added to the plasma gas mix are shown in FIG. 16 which clearly shows that with increasing argon concentration the peak resonance shifts to the lower frequencies. Both the peak resonance frequency position and the integrated area of the feedback voltage as a function of argon concentration are plotted in FIG. 17, which confirm an approximately linear relationship between the change in resonance frequency and the argon concentration based on the theoretical expectation.

Note that the frequency chirp method makes the shift in peak resonance frequency due to bulk capacitance changes observable either electrically, optically or by using other suitable methods either alone or in combination. This can be used in an embodiment where the chirp is applied on a regular or variable basis and the plasma excitation frequency is actively adapted to coincide with the peak resonance related to that species mixture, thereby maximising both the optical signal and power transfer efficiency to plasma.

Note that other parameters could also be monitored, from which similar effects could be seen. These could be emitted light intensity or intensities and as well as the non-optical measurement illustrated above, from which a gas concentration could be measured. For example, $V_{fb}$ directly, the applied voltage to the plasma cell or the total applied power would give similar results. This means that we can use a variety of non-optical techniques for determining the measurand concentration. Non-optical methods enable production cost reduction and simplification of build, as well as potentially a more robust structure. In addition, since there do not need to be windows, there is no risk of exposure to high levels of ultraviolet light for people (damage to eyesight and/or skin) or surrounding materials (uv degradation).

Note also that this measurement is more suitable for certain gas mixtures rather than others. For example, it is optimally suitable for binary or pseudo-binary (where two of the components behave in a very similar manner) mixtures. More complex mixtures of three or more components may be possible by using chemometrics (composition dependent) on the resultant frequency spectrum or by independently measuring one or more of the components and feeding that information back into a correction algorithm to determine the concentration of the species of interest. The independent measurement(s) of one or more species could be done optically from the plasma cell, still achieving simplification of build and reduced cost, by needing fewer optical components and detectors, compared to a purely optical measurement. In addition, the interaction of the species in a plasma is also of interest. Dependent on the gas component energy states and chemical reactions possible, this technique might be more or less effective. With noble gases, this technique is likely to be useful, but where there is a large discrepancy in component properties, this might render this technique less appropriate.

Figure 18:
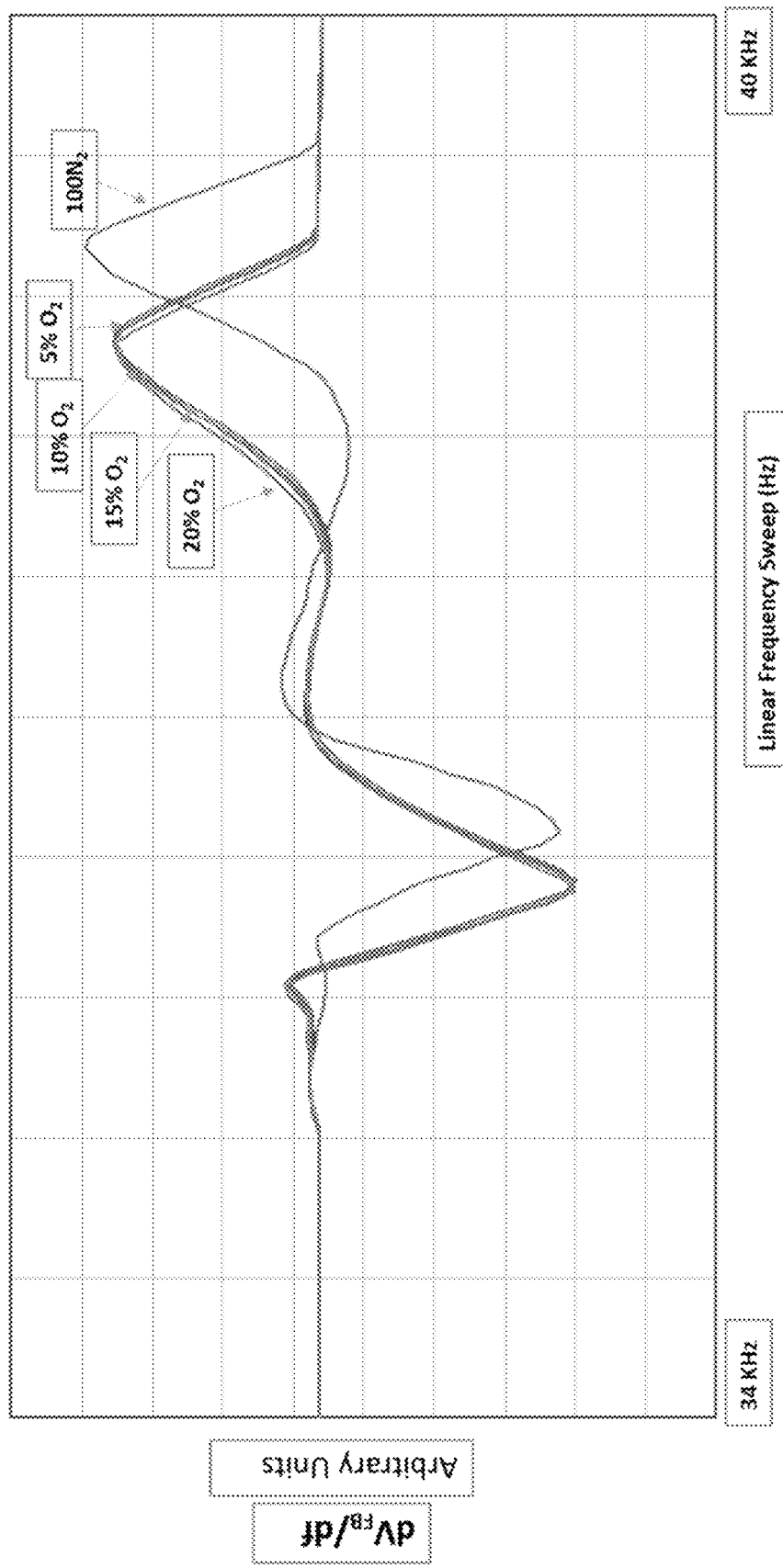
FIG. 18 is a graph showing a derivative of feedback voltage with increasing oxygen concentration in an $N_2$ background plasma.

An example of where there is a large difference in component properties is shown by the addition of percent level oxygen into the $N_2$ plasma. The feedback signal was monitored during the frequency chirp excitation and results shown in FIG. 18. This shows a marked difference to the argon mix in $N_2$. The strong quenching effect of oxygen is visible to the extent that above 5% $O_2$ there is only small discernible changes in the resonance frequencies. This shows that addition of further $O_2$ levels into the plasma primarily serves to extract the energy of the ionised species and convert them into oxidation chemical reactions, thus levelling off the amount of polarisation and ionisation within the plasma gap. Note, however, that even for a mixture of these species, large changes in the capacitive properties may be observed at low level oxygen changes, which could be useful in certain measurement systems.

Figure 19:
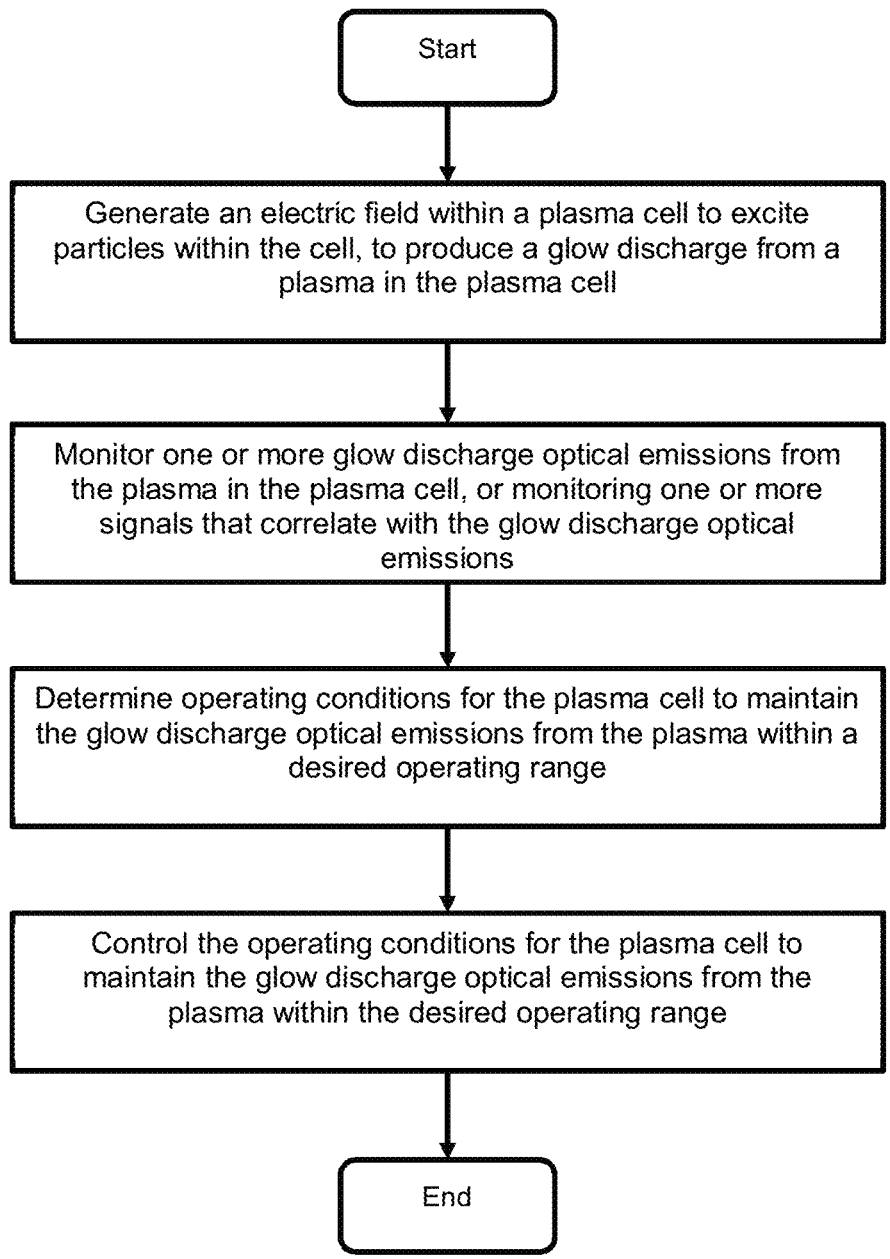
FIG. 19 represents the steps of an example method for gas species concentration determination using resonant current feedback.

FIG. 19 shows an example of the steps taken in the described methodology to implement the resonant current feedback in a preferred embodiment.

Since a plasma is an ionised gas that is electrically conductive, it is able to interact with external electric and magnetic fields. The major constituents of a plasma are free neutral atoms or molecules, positively charged ions or metastable species, free electrons and a variety of energetic photons. These species are in a state of constant collisions. The degree of ionisation in a plasma is the ratio of number density of charged species to the neutral species.

There are three main light production processes in a plasma described as follows:

i. Free-Bound Transitions or Recombination Radiation:

A free electron in a plasma can also be captured by an ion; also known as radiative recombination. If this capture or recombination is to the ground state, a photon with an energy greater than the ionisation potential of the ion or atom is emitted, producing a continuous spectrum. Alternatively, if the recombination is to an excited energy level, the electron cascades down through the excited states to the ground state by releasing photons of unique wavelengths, thus producing the emission lines characteristic of that ion species.

ii. Bound-Bound Transitions

These transitions happen when a change to the energy of an electron within an atom or a molecule is such that the electron remains attached or bound to the atom or molecule both before and after the change. In the case where energy is increased, typically a photon roaming the plasma is absorbed. When the energy is reduced, a photon is emitted. Bound-bound transitions in a plasma can produce both emission and absorption lines unique to the atomic or molecular species.

iii. Free-Free Transitions: Bremsstrahlung

In any plasma there are many unbound electrons which can freely interact with other species. When a free electron in a plasma passes close to an ionised atom or molecule, it is either accelerated or decelerated. This results in a net change of the kinetic energy of that electron. Quantum mechanics dictates that this change of energy is quantised and mediated by either absorbing or emitting a photon by the electron. Since these photons can be of any wavelength, radiation produced in this process has a continuous spectrum and is also known as thermal bremsstrahlung.

Within a plasma itself, several processes occur that enable the above transitions, with the most important process being collisions among species. An important set of collisions is those between the electrons/charged species and neutrals which leads to ionisation. For this to happen, a fraction of the electrons or charged species need to have kinetic energies exceeding the ionisation potential of the gas of interest. Conversely, collisions can also lead to the recombination process, where the impact between the charged species of opposite polarity can lead to the production of neutral species.

Figure 20:
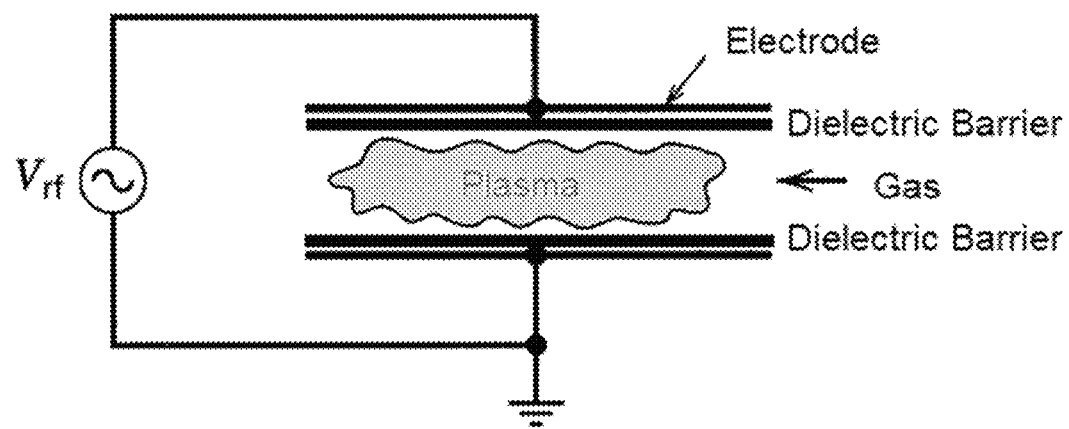
FIG. 20 is a simplified schematic representation of a system for generating a glow plasma.

One method of producing a glow plasma is by means of high voltage radio frequency (RF) excitation of a gas flowing in a dielectric barrier vessel (commonly glass or quartz) surrounded by conductive electrodes. This is shown schematically in FIG. 20. In each typical RF excitation cycle, charged species in a plasma experience peak acceleration in opposite directions in the electric field twice. On the positive side of the sinewave excitation, this acceleration peaks near the top of the waveform. Similarly, on the negative side of the sinewave excitation, the charged species experience peak acceleration in the opposite polarity near the trough of the waveform. Since all three light production processes described above will also peak during these high acceleration events, the instantaneous light produced from any glow plasma will exhibit two distinct peaks and troughs during each individual typical cycle of RF excitation.

Figure 21:
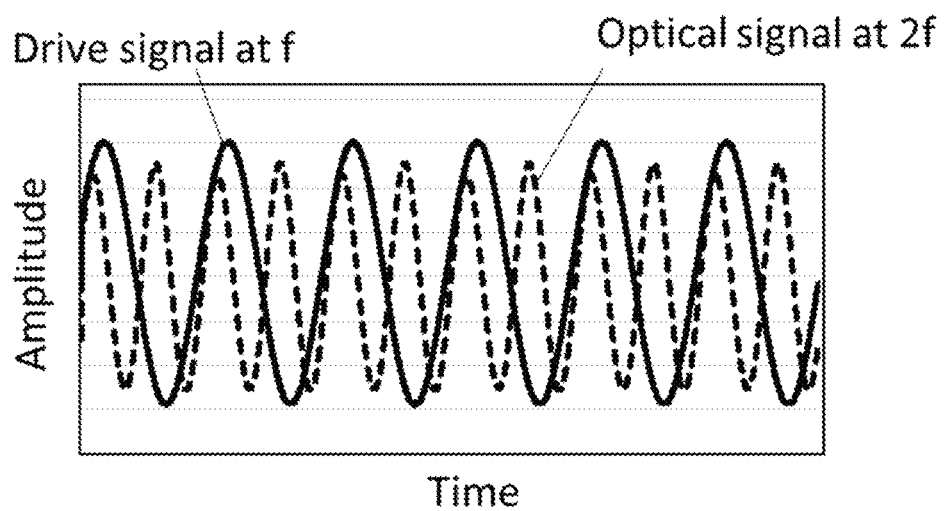
FIG. 21 illustrates an excitation waveform at frequency f and a detected optical signal with frequency 2f.

This has been experimentally verified by the inventors using a high-speed photodiode amplifier circuit detecting the instantaneous light signal through a narrow optical bandpass filter centred around 337 nm in a $N_2$ glow plasma. This is clearly illustrated in FIG. 21, where the excitation signal at frequency f and the detected signal is at twice the excitation frequency (2f). There is a phase shift between the excitation and drive waveforms due to instrumentation, plasma species inertia and other factors, as illustrated in FIG. 21.

Until relatively recently, the accurate acquisition and processing of these signals would have been extremely difficult to accomplish in real time. There are also specific design recommendations to make the detectors sufficiently fast to respond at the drive frequencies which are typically used (10s of kHz or higher), which are not generally required or used in standard optical plasma measurements. This is the reason why many plasma gas detectors use an integrated or DC signal as the processed detection signal. It is also one of the main reasons why this non-intuitive approach proposed by the inventors has not been considered previously.

Figure 22:
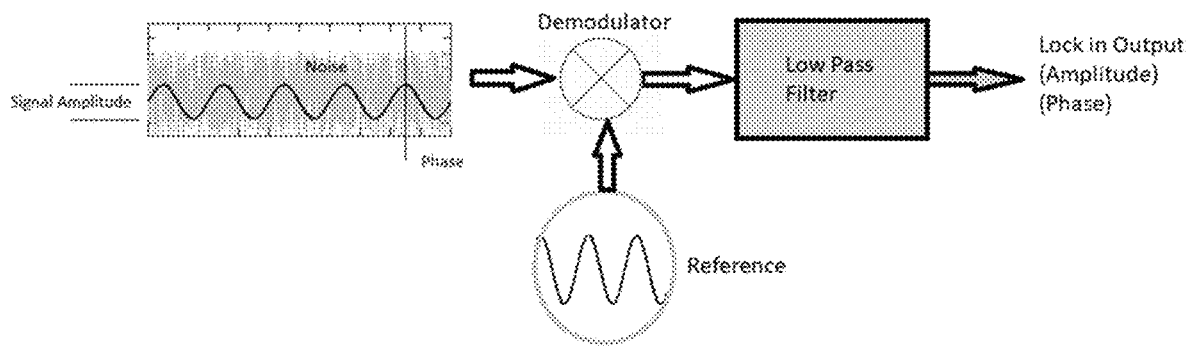
FIG. 22 is a schematic illustration of the Lock-in detection technique.
Figure 23:
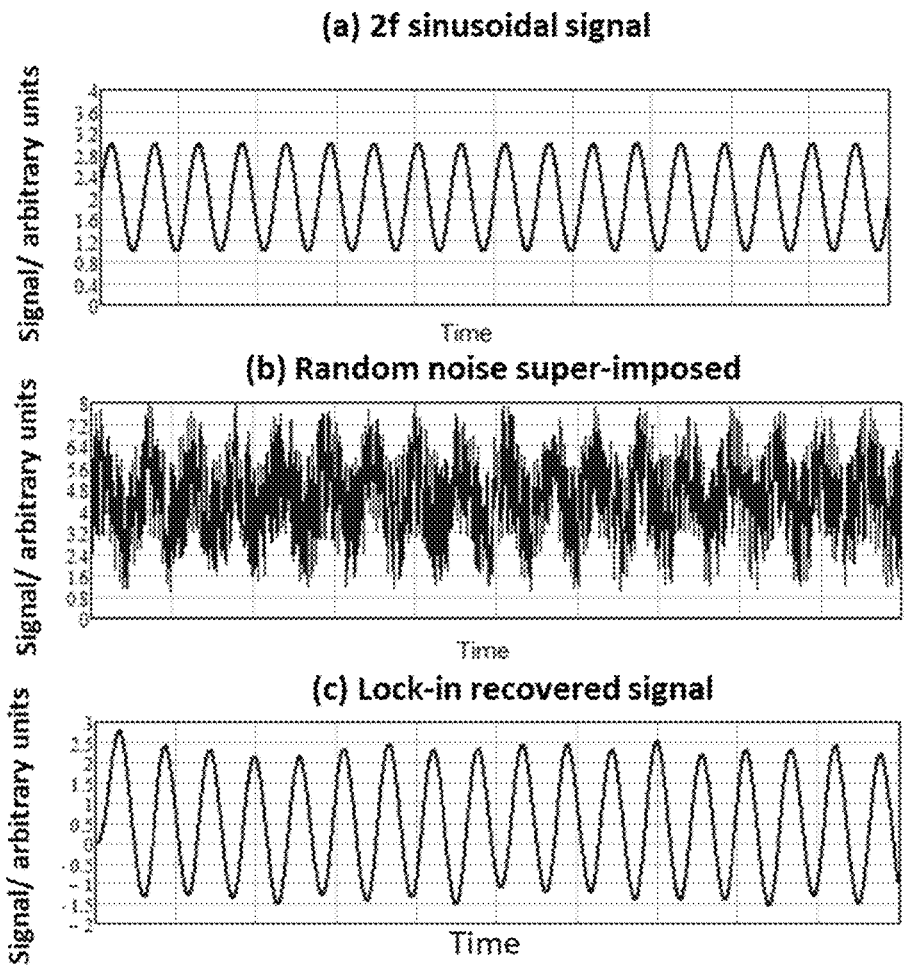
FIG. 23 illustrates the benefits of using Lock-in detection.

The knowledge that the emitted light from a plasma has a $2^{nd}$ harmonic (2f) component correlated to the plasma RF excitation waveform allows it to be extracted from noisy backgrounds with extremely high noise rejection. One conventional methodology to achieve this is called Lock-in detection. The key strength of a Lock-in detector is its ability to extract a signal amplitude and phase in very noisy environments. In effect, Lock-in detection is like a Fourier Transform with a single frequency (2f) component, with all other coefficients being set to zero. Typically, it uses a homodyne detection scheme followed by low-pass filtering to extract a desired signal amplitude and phase relative to a periodic reference (see FIG. 22). The shape of the 2f periodic reference waveform could take many forms including sinusoidal, square wave or other appropriate shape to optimally extract the desired process signal. This detection occurs in a well-defined narrow frequency band around the reference frequency, efficiently rejecting all other frequency contributions from other spurious sources. Using this technique allows the photodiode or other appropriate detection means (e.g. photomultiplier, bolometer, pyroelectric or thermopile detector) detection of plasma light at an extremely narrow bandwidth leading to significantly lower thermal and shot noise contribution from the amplifiers. The magnitude of improvement that can be achieved by using the Lock-in technique can be seen in FIG. 23 for simulated data. Graph (a) shows the clean 2f signal, whilst (b) shows the effect of adding large scale random noise to the signal. Even with such large noise, Lock-in detection is capable of recovering the original signal effectively as can be seen in graph (c). In practice, a silicon photodiode is both an economical and versatile solution, with potentially fast detection across a broad range of ultraviolet, visible and near infrared wavelengths. Another important consideration is the presence of ambient light. Most light detection from a glow plasma occurs in the near ultraviolet and visible band of wavelengths. This is also the band of wavelengths where significant spurious ambient light sources exist. The $2^{nd}$ harmonic detection of plasma light gives an enhanced rejection of ambient sources, which will be generally modulating at a much lower frequency, making the task of light shielding of a plasma detector significantly easier.

If a glow plasma spectroscopic instrument is to be used for measuring trace levels of a gas species, it must be capable of achieving two important signal processing objectives at the same time. Firstly, a significantly higher gain is required to make the weak emission detectable. Secondly, a much higher resolution digitiser is needed to provide measurement resolution. Post processing of the 2f signal is extremely important in the case of a weakly emitting component. The $2^{nd}$ harmonic signal may be processed in two ways such as in a conventional design by means of analogue Lock-in detection using multipliers and low-pass filters. These analogue circuits are prone to drift however and come with the hefty penalty of additional noise contribution. Alternatively, in a modern electronic architecture, the $2^{nd}$ harmonic signal will be digitised directly in a fast low-noise Analogue to Digital Converter (ADC). All processing is then performed digitally from here onwards to limit noise contribution. In order to cover a wide range of gas concentrations over all the possible range of intensity transmissions encountered in industrial applications, preferably a 16-bit or higher resolution ADC will be required. The $2^{nd}$ harmonic signal itself may be treated as a digital frame or a scan. A high-speed time critical real-time data acquisition algorithm using a micro-processor performs all the digital Lock-in tasks including the front-end frame averaging, multiplication by a reference 2f frame, potentially followed by a proprietary shape recovery algorithm possibly using FFT techniques to optimise computational efficiency. In practice, a weak 2f signal may be corrupted by a mix of random and systematic distortions, therefore, shape discrimination of the weak profiles may play a vital part of the signal recovery. Experiments during the feasibility work with various configurations showed that a unique blend of high-gain AC-coupled analogue front end followed by propriety high-speed digital signal processing successfully recovered weak signals. The excitation waveform is typically sinusoidal in shape, which may be convenient, especially if Lock-in or FFT techniques are performed, however, other profiles may be used and instrumentation and/or other factors may distort the excitation profile and this may be significant in any post processing, especially with regard to any shape or matched filter usage. The phase angle and/or signal at frequencies other than 2f also contain signal enhancement information or background compositional data and can be used to extract extra signal processing information. For example, a change in the phase angle can be related to the target gas concentration within a mixture and/or related to background mixture composition for non-binary gas mixtures.

In summary, light detection at 2f is superior to conventional photodiode light detection at DC due to the following advantages:
1. Improved signal to noise ratio.
2. Detection at an extremely narrow bandwidth leading to lower thermal and Shot noise.
3. Enhanced rejection of spurious sources of light such as ambient light.

However, detection of light at 2f in real time at high frequencies has the following new design recommendations for successful performance:
1. Low capacitance and high shunt resistance of the photodiode element.
2. Techniques to lower junction capacitance such as reverse biasing of photodiode.
3. High speed trans-impedance amplifier.
4. Active cancellation of DC light signal, since without this high gain amplification is not possible.
5. Active suppression of 1f signal (e.g. via a notch filter), since without this high gain amplification is not possible.
6. Fast analogue to digital conversion (e.g. >10 times oversampling of the 2f signal).
7. Demodulation and Lock-in detection followed by filtering performed in digital domain to avoid additional noise contribution from analogue circuits.

The above described method for signal processing is advantageous for use in glow discharge optical emission spectroscopy, for online gas analysis. This method for signal processing will also provide processing enhancements for any other oscillating drive glow plasma formats. When the above-described signal processing method is used with enhanced glow plasma stability at atmospheric pressure, such as described above, a significant improvement in on-line gas analysis is achievable using GD-OES. This can be achieved without the need for secondary electrodes to apply a transverse electric field or to provide electron-injection, which would involve extra build and operational complexity. Also, in the case of electron injection, the presence of such secondary electrodes within the gas stream would expose them to potential contamination and corrosion. As the gas of interest is carried into the plasma, it is excited and the light emitted by the radiative decay is detected by a spectrometer for its unique wavelength signature. OES offers a non-intrusive and very specific information not only on plasma chemistry, but also on the relative concentration of the species. Unlike conventional GD-OES systems, gas analysis applications often require that the gas stream itself does not come into physical contact with the high voltage electrodes to avoid any sputtering effects or chemical reactions on the electrodes. In many gas analysis applications, the gas of interest is in a continuous flow regime which requires a fast response for spectroscopic detection and species identification.

An example method comprises:
  generating one or more oscillating electromagnetic fields within a plasma cell to excite particles within the cell, to produce a glow discharge plasma in the plasma cell, and controlling the operating conditions for the plasma cell to maintain glow discharge optical emissions from the plasma within the desired operating range; and
  monitoring one or more glow discharge optical emissions from the plasma in the plasma cell;
  wherein said monitoring of the optical emissions comprises: measuring the optical emissions, or measuring a signal that correlates with the optical emissions, at twice the plasma excitation frequency; and processing the signal in real time during each excitation cycle to determine the concentration of a gas within a gas mixture.

As options for this example "2f monitoring" method, the following features can be used separately or in combination:
  the monitoring comprises measuring the optical emissions in real time using an optical detector;
  the optical signal collection is accomplished after passing through the transmission band of an optical filter or by using a dispersive grating or other appropriate wavelength selection device;
  processing the signal is completed in real time using digital signal processing;
  a notch filter is used to narrow the frequency bandwidth of the signal and obtain separation in frequency from the excitation frequency;
  detection techniques to examine and determine the 2f signal include one or more of the following: Lock-in detection, synchronous detection, frequency domain analysis such as by using Fast Fourier Transforms (FFTs) and time or frequency domain matched filter techniques, shape filters or other appropriate processing means;
  the signal measurement is measurement of the peak heights, the peak areas or integrals of the 2f signal, but other techniques are also possible;
  suitable post signal filtering is applied such as a median filter and/or ensemble averaging and/or moving averaging;
  the drive waveform is sinusoidal, or the drive waveform is a square wave or a smooth, non-sinusoidal function;
  the phase angle of the 2f signal between the excitation waveform and optical signal and/or the amplitude, width, area or other feature of frequency signal components other than at 2f may be used to enhance determination of gas concentration and/or background gas composition;
  an electric field across the plasma cell is generated by an alternating excitation voltage and the controlling is undertaken on a cycle-by-cycle basis, or a magnetic field is generated by an alternating excitation current in an electromagnet and the controlling is undertaken on a cycle-by-cycle basis, or both electric and magnetic fields are used in combination;
  the monitoring of the optical signal comprises measuring the amplitude of the 2f signal and the monitoring is used to determine the concentration of a gas within a gas mixture, and optionally the change in 2f signal amplitude with gas concentration may be linearized from a theoretical fit, polynomial, other appropriate mathematical relationship or combination of two or more of these.

An alternative example system comprises:
  a plasma cell;
  a voltage generator for generating one or more oscillating electromagnetic fields within the plasma cell, to excite particles within the cell to produce a glow discharge plasma in the plasma cell;
  a voltage controller for controlling the operating conditions for the plasma cell to maintain glow discharge optical emissions from the plasma within a desired operating range; and
  one or more optical detectors coupled to one or more measurement circuits configured to monitor glow discharge optical emissions from the plasma in the plasma cell, wherein said monitoring of the optical emissions comprises measuring the optical emissions, or measuring a signal that correlates with the optical emissions, at twice the plasma excitation frequency;
  wherein the system is configured to process the signal in real time during each excitation cycle using a signal processor to determine the concentration of a gas within a gas mixture.

As options for this example 2f monitoring system, the following additional features can be used, either separately or in combination:
  photodiodes, such as silicon photodiodes, can be used to monitor the optical emissions, the photodiodes having intrinsically low capacitance and high shunt resistance and being used to monitor the optical emissions in the ultraviolet, visible or near infrared light range, and optionally the photodiodes may be reverse biased to reduce the intrinsic capacitance;
  the signal collection is achieved after passing through the transmission band of an optical filter or by using a dispersive grating or other appropriate wavelength selection device.
  the glow plasma is controlled by using a Royer transformer in a self-oscillating scheme to maintain a stable plasma. This enables a controlled glow plasma to be maintained over a narrow range of conditions.
  secondary stabilization electrodes are used to apply a transverse electric field and/or to provide electron-injection.
  a stable glow discharge plasma is maintained in a plasma cell by applying an input signal from a voltage generator to two or more electrodes in the plasma cell to generate a voltage gradient between the electrodes, measuring an induced signal across the plasma cell using a meter, and using a comparator to compare the induced signal with a reference signal to obtain a difference signal; and a controller then determines a control signal which is then applied to the at least two electrodes in the plasma cell based on the obtained difference signal to achieve a desired voltage gradient for the excitation that is needed for a stable glow. This method is all achieved in real time during each cycle; and optionally the induced signal is the plasma current and the reference signal is the drive current waveform.

an electric field is generated by an alternating excitation voltage and the controlling is undertaken on a cycle-by-cycle basis;

the alternating excitation voltage is controlled to have a frequency within a determined resonant frequency band;

the electric field is generated between two or more electrodes within the plasma cell, and controlling the operating conditions comprises controlling the voltage gradient between the electrodes, to achieve a desired electrical current between the electrodes;

the controlling comprises adapting an excitation waveform, frequency, current and/or voltage;

the determining comprises comparing a measured voltage proportional to the plasma current with a reference voltage;

the system is responsive to changing operating conditions for the plasma cell to control each of a plurality of different operating conditions for the plasma cell, and optionally the control of a plurality of operating conditions comprises high frequency adjustments to one or more electrical input parameters and/or low frequency adjustments to one or more physical configuration parameters;

the system is adapted to transfer energy to gas molecules before the molecules enter the plasma cell, such as controlling temperature, pressure, excitation or ionisation of the gas molecules;

a drive frequency is scanned or chirped across a defined frequency range, either on a regular or variable basis, and a plasma excitation frequency is actively adapted to coincide with the peak resonance related to a species mixture to be analysed;

a sample gas is maintained at a determined, controlled temperature prior to entry to the plasma cell;

the plasma cell is maintained at a determined, controlled temperature;

a flow rate of gas through the plasma cell is maintained at a determined, controlled flow rate;

or the flow rate is adapted with a feedback system to maintain the plasma current at a determined value;

one or more dopants are added to the sample gas prior to entry to the plasma cell, wherein optionally a dopant is water;

the plasma cell is at or maintained at atmospheric pressure or higher than atmospheric pressure; or pressure in the plasma cell is adapted with a feedback system to maintain the plasma current at a determined value;

generating a magnetic field within a plasma cell is accomplished using an electromagnet;

the plasma cell has at least one optically transmissive element, transparent to the wavelength range of the light of interest; optionally wherein the optically transmissive element is photostable and non-luminescing, and optionally includes one or more of the following: windows, lenses, diffraction gratings, optical filters or spectrometers; and/or optical fibres are used to transfer the optical output to a non-line-of-sight destination and/or from a hot region containing the plasma cell to a cooler region where the electronics can operate within their operational ambient temperature limits and/or allowing the siting of the detector and/or signal processing electronics at a distance away from the plasma cell and the high associated electromagnetic fields.

The above described methods, apparatus and systems enable processing of optical signals with enhanced signal to noise recovery. Various of the methods, apparatus and systems described herein also mitigate the plasma stability shortcomings of previous methods, via control of the plasma working conditions, to achieve a stable glow plasma under a very wide range of conditions (e.g. composition, types of gases, concentrations of gases and flow rates).

Experimental Results:

Due to bremsstrahlung background radiation, an optical 2f signal may be present, even in the absence of any actively emitting species. Also, dependent on the gas mixture, the 2f optical signal may be due to direct photon emission by an excited gas species (e.g. argon in nitrogen), quenching or reduction of the emission of another species (e.g. nitrogen by oxygen or hydrogen) or enhancement of emission by the presence of another species (e.g. nitrogen by helium) or a combination of two or more of these processes. Enhancement of nitrogen emission at 337 nm by helium, for example, is due to the fact that the helium has a lower ionisation energy and hence can enhance the nitrogen excitation and therefore emission (Penning ionisation). Note that the relationship between gas concentration and the 2f signal (such as the amplitude or integrated area) may be linear or non-linear, dependent on the gas mixture and concentration range; this is also true for the other methods and systems described above. In the case of a non-linear signal, the output may be linearized from an empirical or theoretical fit, polynomial, other appropriate mathematical relationship or combination of two or more of these.

Figure 24:
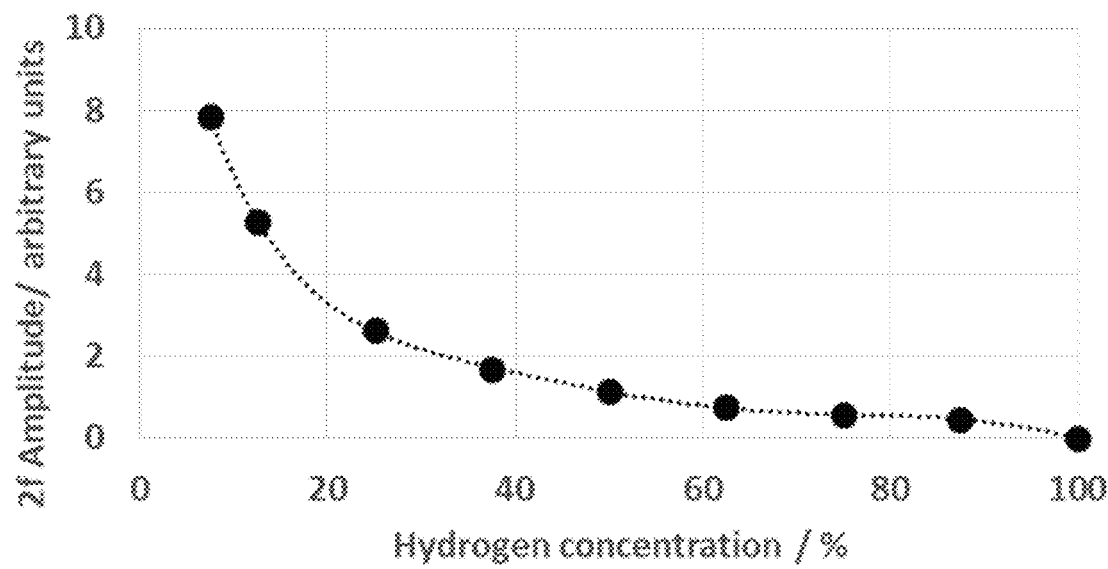
FIG. 24 is an illustration of the 2f signal amplitudes for hydrogen/nitrogen mixtures.

The performance of the 2f detection method was verified using new signal electronics and software. FIG. 24 shows the effect of hydrogen on nitrogen emission at 337 nm. The results are plotted of the 2f peak heights derived from oscilloscope traces vs the gas concentration. It can be seen that the hydrogen is quenching the nitrogen emission in a non-linear way.

Figure 25:
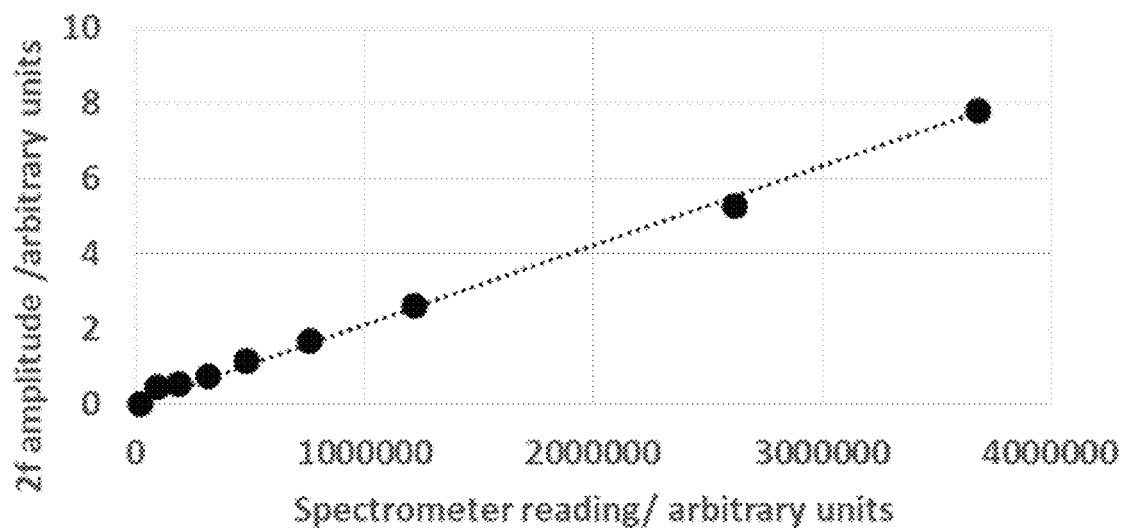
FIG. 25 is an illustration of the comparison between 2f amplitude and spectrometer amplitude results.

The correspondence of this 2f method to the conventional DC type measurement is clearly shown in FIG. 25, where the reference amplitude is derived from a spectrometer (using a diffraction grating and photodiode array) amplitude reading and shows an identical relationship of intensity with concentration by whichever method is employed, but with the 2f method providing performance improvements in the signal to noise.

Figure 26:
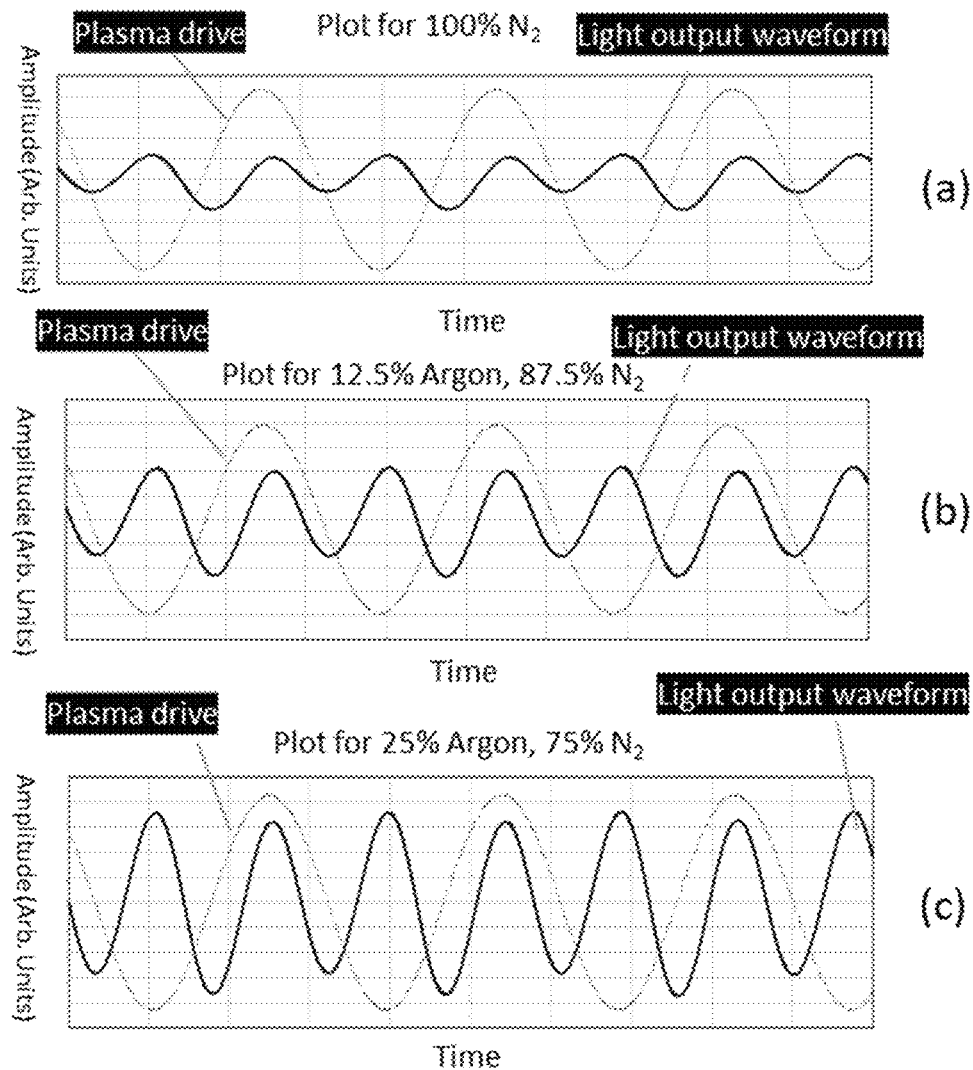
FIG. 26 is an illustration of the signal waveforms for argon/nitrogen mixtures.
Figure 27:
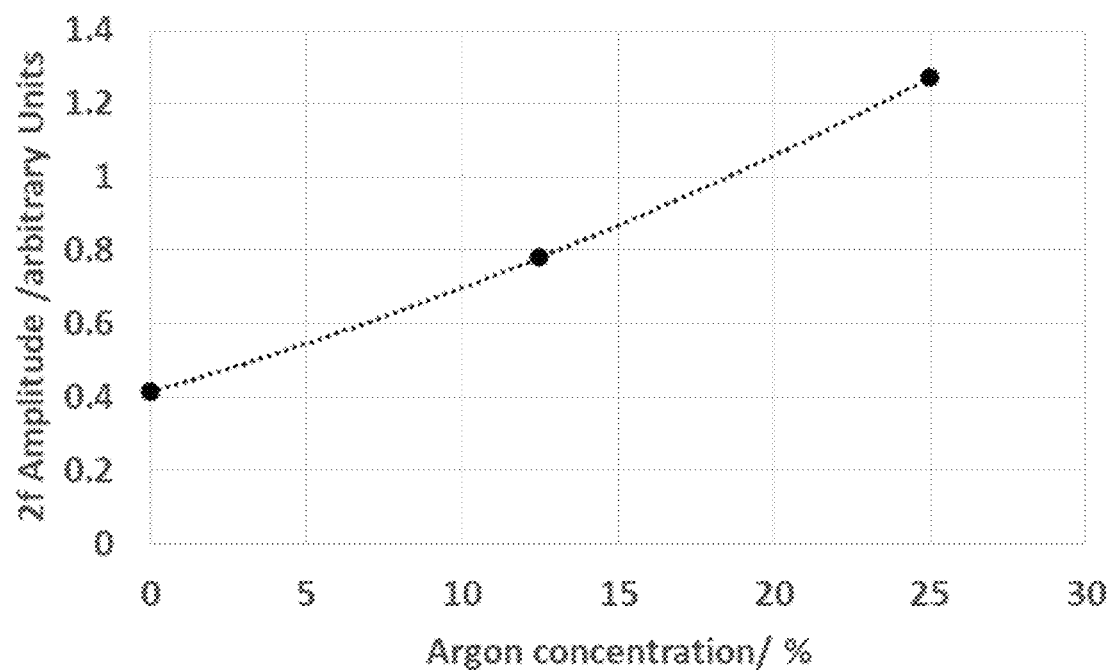
FIG. 27 is an illustration of the Lock-in amplitude for argon/nitrogen mixtures.

Experiments were also performed to illustrate the 2f detection method using 2f amplitude and Lock-in detection which are shown in FIGS. 26 (a) to (c). This was performed for argon in a background of nitrogen, with optical signal monitoring after an optical pass band filter centred at 780 nm with a silicon detector. Asymmetry of the 2f signal is a result of asymmetry in the electrodes and/or the detector position and orientation. The optical output maxima at 2f are clearly seen in all three graphs (a) to (c) of FIG. 26, as are the increasing amplitudes with argon concentration. FIG. 27 shows the relationship of the amplitude after 2f Lock-in detection with argon concentration and can be seen to be slightly non-linear over this concentration range.

The invention claimed is:

1. A method for stabilization of a glow discharge from a plasma that is generated within a plasma cell, for measuring concentration of one or more gases in a gas mixture, the method comprising:

supplying a gas mixture to the plasma cell as a gas flow;
generating an electric field within the plasma cell using an alternating excitation voltage to excite gas particles within the plasma cell, to produce a glow discharge from a plasma in the plasma cell;
monitoring, in each excitation cycle of the alternating excitation voltage, one or more electrical signals that correlate with glow discharge optical emissions from the plasma in the plasma cell, wherein the one or more electrical signals comprise a plasma excitation current or an electrical current in a feedback circuit;
in response to said monitoring of the one or more electrical signals, controlling one or more operating conditions for the plasma cell in a resonant condition to maintain the glow discharge emissions from the plasma within a desired operating range in each excitation cycle of the alternating excitation voltage, thereby to stabilize the glow discharge emissions; and
using the stabilized glow discharge emissions from the plasma in the plasma cell or one or more electrical signals that correlate with the stabilized glow discharge optical emissions to measure the concentration of one or more gases in a gas mixture supplied to the plasma cell.

2. The method according to claim 1, wherein the alternating electric field is generated between two or more electrodes on the plasma cell, and controlling the operating conditions comprises applying an alternating excitation voltage between the electrodes and controlling the excitation voltage to have a frequency within a determined resonant frequency band.

3. The method according to claim 1, wherein the electric field is generated between two or more electrodes on the plasma cell, and controlling the operating conditions comprises controlling the voltage gradient between the electrodes, to achieve a stable electrical current between the electrodes.

4. The method according to claim 1, wherein the monitoring comprises monitoring a plasma excitation current.

5. The method according to claim 1, wherein the monitoring comprises monitoring an electrical current in a feedback circuit and the controlling comprises modifying the electrical voltage supplied to electrodes on the plasma cell in response to the monitored electrical current.

6. The method according to claim 1, wherein the controlling comprises adapting an excitation voltage waveform and/or frequency.

7. The method according to claim 1, wherein the monitoring comprises comparing a measured voltage proportional to the plasma current with a reference voltage.

8. The method according to claim 1, which is adapted to control a plurality of different operating conditions for the plasma cell.

9. The method according to claim 8, wherein the control of a plurality of operating conditions comprises high frequency adjustments to one or more electrical input parameters and/or low frequency adjustments to one or more physical configuration parameters.

10. The method according to claim 1, further comprising: transferring energy to gas molecules before the molecules enter the plasma cell, such as controlling temperature, pressure, excitation or ionisation of the gas molecules.

11. The method according to claim 1, wherein the concentration of the one or more gases is measured by optical means.

12. The method according to claim 11, wherein the optical measurement comprises either: a wavelength selection by one or more bandpass filters and a detection by one or more optical detectors; or a wavelength selection by a diffraction grating and a detection by one or more optical detectors; or a wavelength selection by means of a spectrometer.

13. The method according to claim 1, where the concentration of the one or more gases is measured non-optically by measuring one or more electrical parameters generated by an electrical feedback circuit, such as a feedback sense voltage or a voltage gradient of a feedback voltage, or by measuring an excitation voltage or excitation current between electrodes of the plasma cell.

14. The method according to claim 1, wherein a drive frequency is scanned or chirped across a defined frequency range and the variation in a measured parameter or parameters with frequency is used to determine the concentration of a gas component in a gas mixture.

15. The method according to claim 1, wherein a drive frequency is scanned or chirped across a defined frequency range, either on a regular or variable basis, and a plasma excitation frequency is actively adapted to coincide with the peak resonance related to a species mixture to be analysed.

16. The method according to claim 1, wherein the optical measuring comprises measuring a signal at twice the excitation frequency.

17. The method according to claim 1, wherein a sample gas is maintained at a determined, controlled temperature prior to entry to the plasma cell.

18. The method according to claim 1, wherein the plasma cell is maintained at a determined, controlled temperature.

19. The method according to claim 1, wherein a flow rate of gas through the plasma cell is maintained at a determined, controlled flow rate.

20. The method according to claim 1, wherein a flow rate of gas through the plasma cell is adapted with a feedback system to maintain a plasma current of the plasma cell at a determined value.

21. The method according to claim 1, wherein one or more dopants are added to a sample gas prior to entry to the plasma cell.

22. The method according to claim 21, wherein a dopant is water.

23. The method according to claim 1, wherein the plasma cell is operated at or maintained at atmospheric pressure or higher than atmospheric pressure.

24. The method according to claim 1, wherein pressure in the plasma cell is adapted with a feedback system to maintain the plasma current at a determined value.

25. A method for glow discharge optical emission spectroscopy for measuring concentration of one or more gases in a gas mixture supplied to a plasma cell, including stabilization of a glow discharge from a plasma generated within the plasma cell, the method comprising:
supplying a gas mixture to the plasma cell as a gas flow;
generating an electric field within the plasma cell using an alternating excitation voltage to excite gas particles within the plasma cell, to produce a glow discharge from a plasma in the plasma cell;
monitoring, in each excitation cycle of the alternating excitation voltage, one or more electrical signals that correlate with glow discharge optical emissions from the plasma in the plasma cell, wherein the one or more electrical signals comprise a plasma excitation current or an electrical current in a feedback circuit;
in response to said monitoring of the one or more electrical signals, controlling one or more operating conditions for the plasma cell in a resonant condition to maintain the glow discharge emissions from the plasma within a desired operating range in each excitation cycle of the alternating excitation voltage, thereby to stabilize glow discharge emissions from the plasma; and analyzing glow discharge emissions from the plasma in the plasma cell or analyzing the one or more electrical signals that correlate with the glow discharge optical emissions to determine the constituents of the gas mixture supplied to the plasma cell.

26. The method according to claim 25, wherein a drive frequency for generating the electric field is scanned or chirped across a defined frequency range and the variation in a measured parameter or parameters with frequency is used to determine the concentration of a gas component in a gas mixture.

27. The method according to claim 25, wherein a drive frequency for generating the electric field is scanned or chirped across a defined frequency range, and a plasma excitation frequency is actively adapted to coincide with the peak resonance related to a species mixture to be analysed.

28. The method according to claim 25, wherein the monitoring of one or more signals is carried out at twice the excitation frequency of the plasma.

29. The method according to claim 25 wherein said monitoring of one or more signals comprises: measuring the optical emissions, or measuring a signal that correlates with the optical emissions, at twice the plasma excitation frequency; and processing the signal in real time during each excitation cycle to determine the concentration of a gas within a gas mixture.

30. A system for stabilization of a glow discharge from a plasma that is generated within a plasma cell, the system comprising:

a plasma cell for receiving a gas mixture as a gas flow to the plasma cell;

an electric field generator for generating an electric field within the plasma cell using an alternating excitation voltage to excite gas particles within the plasma cell, to produce a glow discharge from a plasma in the plasma cell; and a controller module for:

monitoring, in each excitation cycle of the alternating excitation voltage, one or more electrical signals that correlate with glow discharge optical emissions from the plasma in the plasma cell, wherein the one or more electrical signals comprise a plasma excitation current or an electrical current in a feedback circuit; and, in response to said monitoring, controlling one or more operating conditions for the plasma cell in a resonant condition to maintain the glow discharge emissions from the plasma within a desired operating range in each excitation cycle of the alternating excitation voltage, thereby stabilizing the glow discharge emissions from the plasma; and using the stabilized glow discharge emissions from the plasma in the plasma cell, or using one or more electrical signals that correlate with the stabilized glow discharge optical emissions, to measure the concentration of one or more gases in the gas mixture supplied to the plasma cell.

* * * * *